(12) United States Patent
Nakagami

(10) Patent No.: US 12,041,777 B2
(45) Date of Patent: Jul. 16, 2024

(54) SEMICONDUCTOR STORAGE DEVICE AND METHOD FOR MANUFACTURING THE SAME

(71) Applicant: Kioxia Corporation, Tokyo (JP)

(72) Inventor: Kohei Nakagami, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 260 days.

(21) Appl. No.: 17/458,181

(22) Filed: Aug. 26, 2021

(65) Prior Publication Data

US 2022/0262807 A1 Aug. 18, 2022

(30) Foreign Application Priority Data

Feb. 18, 2021 (JP) ................................. 2021-024244

(51) Int. Cl.
*H10B 43/35* (2023.01)
*G11C 16/04* (2006.01)
*H01L 29/423* (2006.01)
*H01L 29/66* (2006.01)
*H01L 29/792* (2006.01)
(Continued)

(52) U.S. Cl.
CPC ......... *H10B 43/35* (2023.02); *G11C 16/0483* (2013.01); *H01L 29/4234* (2013.01); *H01L 29/66833* (2013.01); *H01L 29/792* (2013.01); *H10B 43/10* (2023.02); *H10B 43/20* (2023.02)

(58) Field of Classification Search
CPC ........ H10B 43/35; H10B 43/10; H10B 43/20; H10B 43/27; H10B 43/40; H10B 43/50; H10B 41/10; H10B 41/27; H10B 41/41; G11C 16/0483; H01L 29/4234; H01L 29/66833; H01L 29/792; H01L 29/79
See application file for complete search history.

(56) References Cited

U.S. PATENT DOCUMENTS 11,456,366 B2 * 9/2022 An ........................ H01L 27/088
11,508,851 B2 * 11/2022 Cho .................. H01L 29/78648
(Continued)

FOREIGN PATENT DOCUMENTS

JP 2012-080105 A 4/2012
TW 1523223 B 2/2016
(Continued)

*Primary Examiner* — Shahed Ahmed
*Assistant Examiner* — Khatib A Rahman
(74) *Attorney, Agent, or Firm* — Foley & Lardner LLP

(57) ABSTRACT

A device includes a semiconductor substrate including a first well region and a second well region; a first transistor including a first gate insulating layer provided above the first well region, a first gate electrode having a semiconductor, and a second gate electrode having a metal; a second transistor including a second gate insulating layer provided above the second well region, a third gate electrode having a semiconductor, and a fourth gate electrode having a metal; an element isolation area disposed between the first and second well regions; and a first insulating layer formed above the element isolation area. The first insulating layer has a first portion extending over the first gate electrode and a second portion extending over the third gate electrode, a portion of the second gate electrode is formed above the first portion, and a portion of the fourth gate electrode is formed above the second portion.

20 Claims, 24 Drawing Sheets

(51) Int. Cl.
*H10B 43/10* (2023.01)
*H10B 43/20* (2023.01)

(56) References Cited

U.S. PATENT DOCUMENTS

| | | |
|---|---|---|
| 2011/0215385 A1 | 9/2011 | Yamazaki |
| 2012/0083077 A1 | 4/2012 | Yang et al. |
| 2015/0187824 A1 | 7/2015 | Yamazaki et al. |
| 2020/0083246 A1 | 3/2020 | Inatsuka et al. |
| 2020/0091188 A1 | 3/2020 | Lee |
| 2020/0111817 A1* | 4/2020 | Yamazaki ............ H01L 29/7869 |
| 2022/0115511 A1* | 4/2022 | An ..................... H01L 27/092 |

FOREIGN PATENT DOCUMENTS

| | | |
|---|---|---|
| TW | 1654739 B | 3/2019 |
| TW | 202011606 A | 3/2020 |

* cited by examiner

SEMICONDUCTOR STORAGE DEVICE AND METHOD FOR MANUFACTURING THE SAME

CROSS-REFERENCE TO RELATED APPLICATION

This application is based upon and claims the benefit of priority from Japanese Patent Application No. 2021-024244, filed Feb. 18, 2021, the entire contents of which are incorporated herein by reference.

FIELD

Embodiments described herein relate generally to a semiconductor storage device and a method for manufacturing the same.

BACKGROUND

A NAND flash memory generally includes a number of memory cells stacked in a three-dimensional manner.

DETAILED DESCRIPTION

Figure 1:
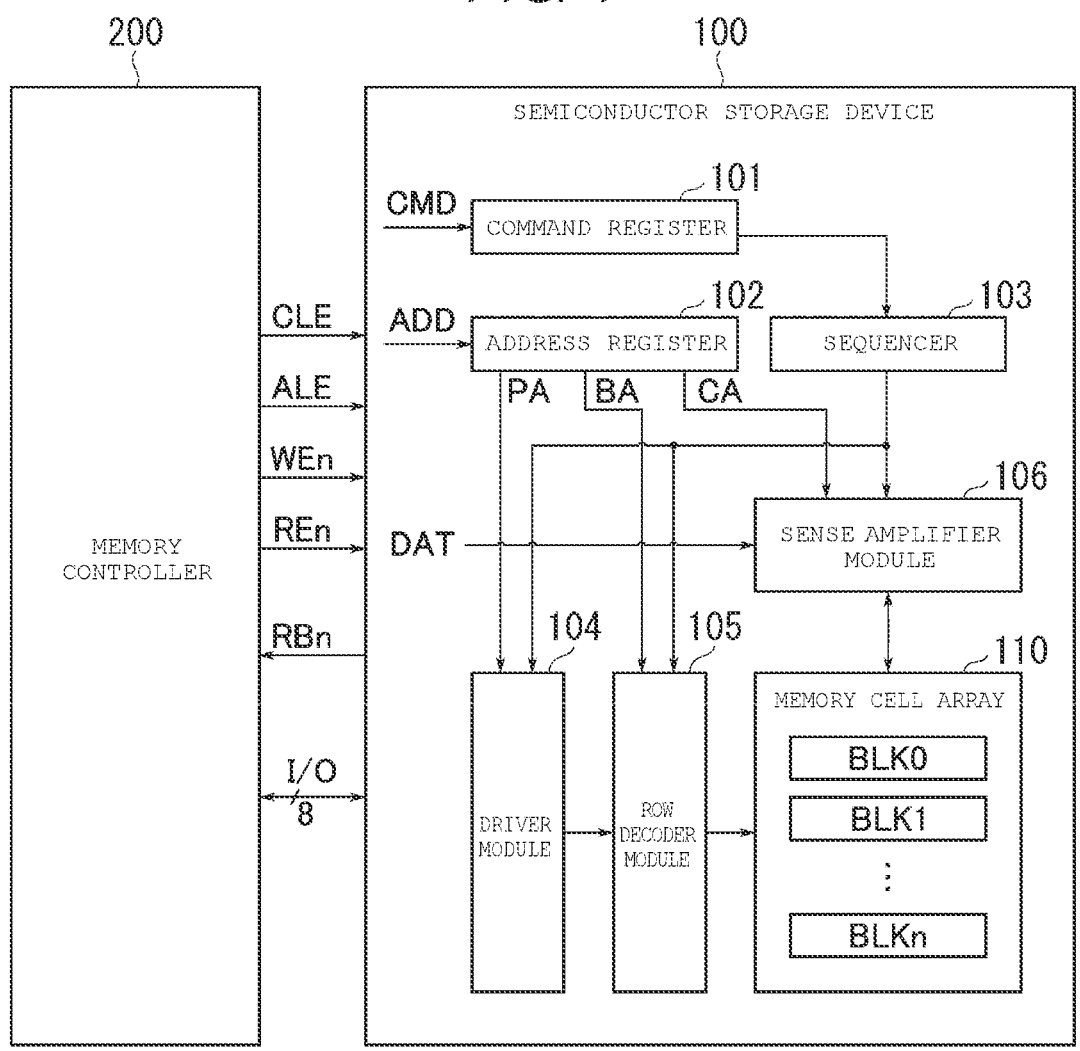
FIG. 1 is a block diagram showing a circuit configuration of a semiconductor storage device according to a first embodiment.

Embodiments provide a semiconductor storage device having excellent integration property and a method for manufacturing the same.

In general, according to one embodiment, a semiconductor storage device includes a semiconductor substrate including a first well region and a second well region arranged in a first direction; a first transistor including a first gate insulating layer provided above the first well region, a first gate electrode provided above the first gate insulating layer and having a semiconductor, and a second gate electrode provided above the first gate electrode and having a metal; a second transistor including a second gate insulating layer provided above the second well region, a third gate electrode provided above the second gate insulating layer and having a semiconductor, and a fourth gate electrode provided above the third gate electrode and having a metal; an element isolation area disposed between the first well region and the second well region; and a first insulating layer formed above the element isolation area. The first insulating layer has a first protrusion portion that extends over the first gate electrode and a second protrusion portion that extends over the third gate electrode. A portion of the second gate electrode is formed above the first protrusion portion. A portion of the fourth gate electrode is formed above the second protrusion portion.

Hereinafter, the semiconductor storage device of the embodiment will be described with reference to the drawings. In the following description, configurations having the same or similar functions are designated by the same reference numerals. Further, a redundant description of those configurations may be omitted. The drawings are schematic or conceptual, and the relationship between the thickness and width of each portion, the ratio of the sizes between the portions, and the like are not always the same as the actual ones.

First, the X direction, the Y direction, and the Z direction are defined. The X direction and the Y direction are directions substantially parallel to a surface of a semiconductor substrate 10 described later (see FIG. 4). The X direction is a direction from one diffusion layer 31 of a transistor 30, which will be described later, toward the other diffusion layer 31. The Y direction is a direction orthogonal to the X direction. The Z direction is a direction orthogonal to the X direction and the Y direction and is a direction away from the semiconductor substrate 10. In the present embodiment, the X direction is an example of a "third direction", the Y direction is an example of a "first direction", and the Z direction is an example of a "second direction".

First Embodiment

FIG. 1 is a block diagram showing a system configuration of a semiconductor storage device 100. The semiconductor storage device 100 is a non-volatile semiconductor storage device, for example, a NAND flash memory. The semiconductor storage device 100 includes, for example, a memory cell array 110, a command register 101, an address register 102, a sequencer 103, a driver module 104, a row decoder module 105, and a sense amplifier module 106.

The memory cell array 110 includes a plurality of blocks BLK0 to BLKn (n is an integer of 1 or more). The block BLK is a set of non-volatile memory cell transistors MC0 to MC7 (see FIG. 2). The memory cell array 110 has a plurality of bit lines and a plurality of word lines. Each of the memory cell transistors MC0 to MC7 is connected to one bit line and one word line, respectively. When each of the memory cell transistors MC0 to MC7 is not distinguished, it may be referred to as a memory cell transistor MC. The detailed configuration of the memory cell array 110 will be described later.

The command register 101 stores a command CMD that the semiconductor storage device 100 receives from the memory controller 200. The command CMD includes, for example, instructions to cause the sequencer 103 to execute a read operation, a write operation, an erasing operation, and the like.

The address register 102 stores address information ADD that the semiconductor storage device 100 receives from the memory controller 200. The address information ADD includes, for example, a block address BA, a page address PA, and a column address CA. For example, the block address BA, the page address PA, and the column address CA are used to select the block BLK, the word line, and the bit line, respectively.

The sequencer 103 controls the overall operation of the semiconductor storage device 100. For example, the sequencer 103 executes the read operation, the write operation, the erasing operation, and the like by controlling the driver module 104, the row decoder module 105, the sense amplifier module 106, and the like based on the command CMD stored in the command register 101.

The driver module 104 generates a voltage that is used in the read operation, the write operation, the erasing operation, and the like. Thereafter, the driver module 104 applies the generated voltage to a signal line corresponding to the selected word line based on, for example, the page address PA stored in the address register 102.

The row decoder module 105 selects one block BLK in the corresponding memory cell array 110 based on the block address BA stored in the address register 102. Thereafter, the row decoder module 105 transfers, for example, the voltage applied to the signal line corresponding to the selected word line to the selected word line in the selected block BLK.

In the write operation, the sense amplifier module 106 applies a voltage to each bit line according to the write data DAT received from the memory controller 200. Further, in the read operation, the sense amplifier module 106 determines the data stored in the memory cell based on the voltage of the bit line and transfers the determination result to the memory controller 200 as the read data DAT.

The communication between the semiconductor storage device 100 and the memory controller 200 supports, for example, the NAND interface standard. For example, in the communication between the semiconductor storage device 100 and the memory controller 200, a command latch enable signal CLE, an address latch enable signal ALE, a write enable signal WEn, a read enable signal REn, a ready busy signal RBn, and an input/output signal I/O are used.

The input/output signal I/O is, for example, a signal having an 8 bit length, and may include the command CMD, the address information ADD, data DAT, and the like.

The command latch enable signal CLE is a signal indicating that the input/output signal I/O received by the semiconductor storage device 100 is the command CMD.

The address latch enable signal ALE is a signal indicating that the signal I/O received by the semiconductor storage device 100 is the address information ADD.

The write enable signal WEn is a signal for instructing the semiconductor storage device 100 to input the input/output signal I/O.

The read enable signal REn is a signal for instructing the semiconductor storage device 100 to output the input/output signal I/O.

The ready busy signal RBn is a signal for notifying the memory controller 200 of whether the semiconductor storage device 100 is in a ready state for receiving an instruction from the memory controller 200 or in a busy state for not receiving an instruction.

The semiconductor storage device 100 and the memory controller 200 described above may constitute one semiconductor device by a combination thereof. Examples of such a semiconductor device include a memory card such as an SDTM card, a solid state drive (SSD), and the like.

Figure 2:
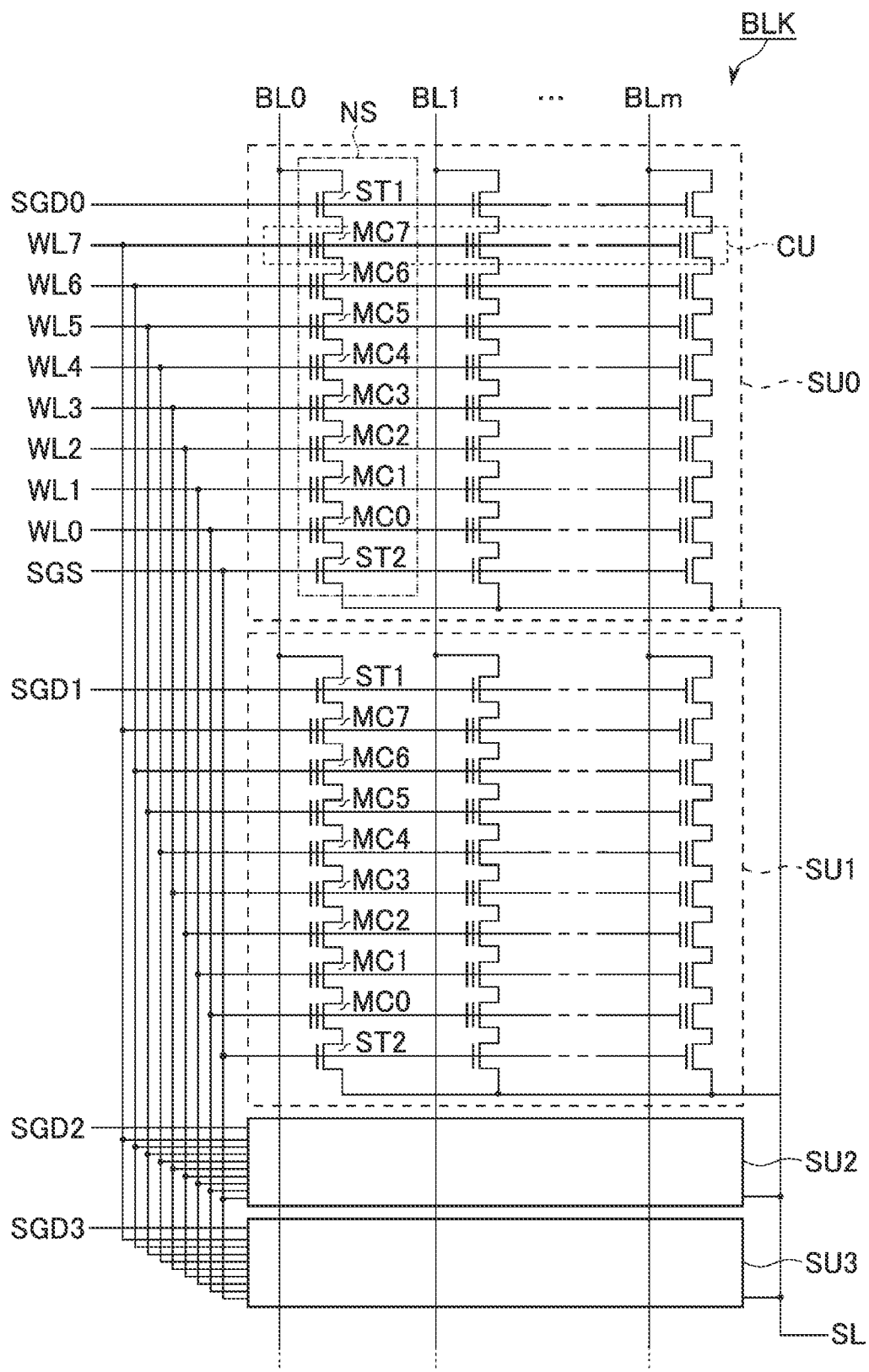
FIG. 2 is a circuit diagram of a memory cell array of the semiconductor storage device according to the first embodiment.

Next, an electrical configuration of the memory cell array 110 will be described. FIG. 2 is a diagram showing an equivalent circuit of the memory cell array 110 and shows one extracted block BLK. The block BLK includes a plurality of (for example, four) string units SU0 to SU3.

The plurality of NAND strings NS are each associated with the bit lines BL0 to BLm (m is an integer of 1 or more). Each NAND string NS includes, for example, memory cell transistors MC0 to MC7 and select transistors ST1 and ST2.

The memory cell transistor MC includes a control gate and a charge storage layer, and stores the data in a non-volatile way. Each of the select transistors ST1 and ST2 is used for selecting the string unit SU during the various operations.

The memory cell transistor MC may be a MONOS type in which an insulating film is used for the charge storage layer, or may be an FG type in which a conductive layer is used for the charge storage layer. Hereinafter, in the present embodiment, the MONOS type will be described as an example.

In each NAND string NS, a drain of the select transistor ST1 is connected to the associated bit line BL and a source of the select transistor ST1 is connected to one end of the memory cell transistors MC0 to MC7 which are connected in series. In the same block BLK, gates of the select transistors ST1 in the string units SU0 to SU3 are commonly connected to the select gate lines SGD0 to SGD3, respectively. The select gate lines SGD0 to SGD3 are connected to the row decoder module 105.

In each NAND string NS, a drain of the select transistor ST2 is connected to the other end of the memory cell transistors MC0 to MC7 which are connected in series. In the same block BLK, a source of the select transistor ST2 is commonly connected to a source line SL, and a gate of the select transistor ST2 is commonly connected to a select gate line SGS. The select gate line SGS is connected to the row decoder module 105.

The bit line BL commonly connects one NAND string NS in each of the string units SU0 to SU3 in each block BLK. The source line SL is commonly connected, for example, among the plurality of blocks BLK.

A set of the plurality of memory cell transistors MC connected to a common word line WL in one string unit SU is referred to as, for example, a cell unit CU. For example, a storage capacitance of the cell unit CU that includes the memory cell transistors MC, each of which stores 1 bit data, is defined as "one page data". The cell unit CU may have a storage capacitance of data with two pages or more depending on the number of bits of data stored in the memory cell transistors MC.

The circuit configuration of the memory cell array 110 in the semiconductor storage device 100 according to the first embodiment is not limited to the configuration described above. For example, the number of memory cell transistors MC and the select transistors ST1 and ST2 in each NAND string NS may be any number. The number of string units SU in each block BLK may be any number.

Figure 3:
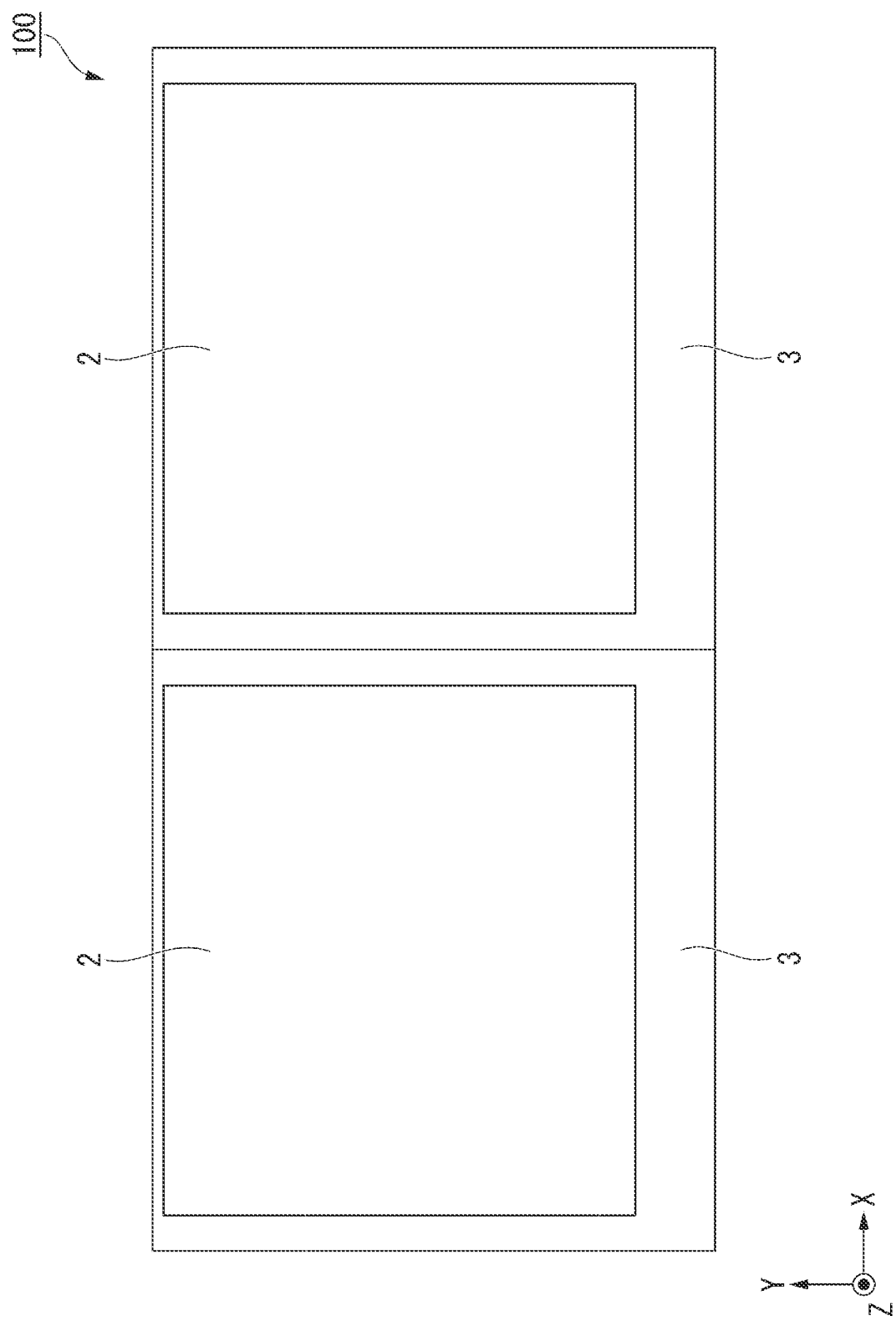
FIG. 3 is a plan view of the semiconductor storage device according to the first embodiment.
Figure 4:
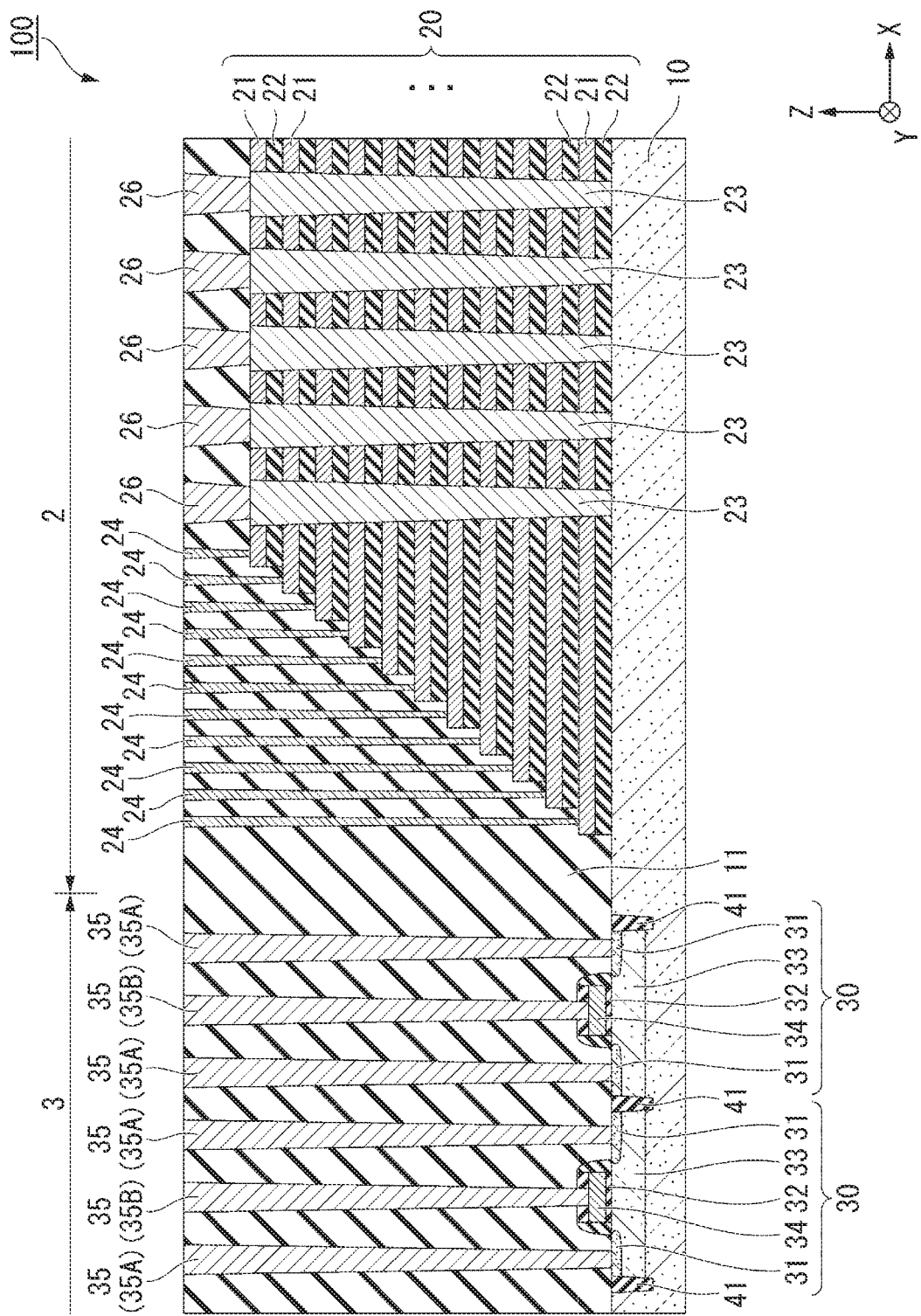
FIG. 4 is a cross-sectional view of the semiconductor storage device according to the first embodiment.

FIG. 3 is a plan view of the semiconductor storage device 100 according to the first embodiment. FIG. 4 is a cross-sectional view of the semiconductor storage device 100 of the first embodiment.

The semiconductor storage device 100 is divided into a memory area 2 and a circuit area 3. The memory cell array 110 described above is formed in the memory area 2. The command register 101, the address register 102, the sequencer 103, the driver module 104, the row decoder module 105, and the sense amplifier module 106 are formed in the circuit area 3.

Although FIG. 3 shows an example in which the circuit area 3 is provided on the side (periphery) of the memory area 2 in the X direction or the Y direction, the circuit area 3 may be provided at a location overlapping with the memory area 2 in the Z direction. For example, the circuit area 3 may be disposed below the memory area 2 (CUA: CMOS Under Array). Further, for example, the semiconductor storage device 100 may be manufactured by bonding a pad on which the memory area 2 is formed and a pad on which the circuit area 3 is formed (CBA: CMOS Bonding Array).

The semiconductor storage device 100 is on the semiconductor substrate 10. The semiconductor storage device 100 is formed in an insulating layer 11 stacked on the semiconductor substrate 10. The semiconductor substrate 10 is, for example, a silicon substrate. The semiconductor substrate 10 extends in the X direction and the Y direction over, for example, the memory area 2 and the circuit area 3. The insulating layer 11 is, for example, a silicon oxide or a silicon nitride.

The memory area 2 is an area in which the memory cell transistors MC for storing data are arranged three-dimensionally. The memory area 2 includes a stacked body 20, a plurality of columnar shape bodies 23, and a plurality of contacts 24 and 26. These structure bodies constituting the memory area 2 are formed in the insulating layer 11. In the present specification, the term "contact" is a connection member having a columnar shape, a truncated cone shape, inverted truncated cone shape, or barrel shape made of a conductive material such as tungsten, for example.

The stacked body 20 includes a plurality of conductive layers 21 and a plurality of insulating layers 22 in the Z direction. The conductive layer 21 and the insulating layer 22 are alternately stacked. The insulating layer 22 insulates between the conductive layers 21 adjacent to each other. The insulating layer 22 contains, for example, a silicon oxide. Each of the plurality of conductive layers 21 and the plurality of insulating layers 22 extends in the X direction and the Y direction. The number of the conductive layers 21 and the insulating layers 22 is any number. Each of the conductive layers 21 corresponds to each of the word lines WL in FIG. 2. Further, in FIG. 4, a case where the X direction (a direction connecting the two diffusion layers) and a direction, in which the conductive layer 21 (word line WL) extends, match with each other is shown as an example, but the case is not limited to this case. For example, the X direction and the direction in which the conductive layer 21 extends may be orthogonal to each other.

Each of the plurality of conductive layers 21 is connected to wiring (for example, a word line) via a contact 24. The conductive layer 21 functions as a select gate line or a gate electrode of a memory cell transistor. The conductive layer 21 contains, for example, tungsten and polysilicon doped with impurities.

The plurality of columnar shape bodies 23 are formed in the stacked body 20. The columnar shape bodies 23 are scattered in the memory area 2 and are arranged in a zigzag shape in the X direction in a plan view from the Z direction, for example. The columnar shape body 23 is connected to wiring (for example, a source line) via the contact 26. Each of the columnar shape bodies 23 extends in the Z direction and penetrates the stacked body 20 in the Z direction.

Figure 5:
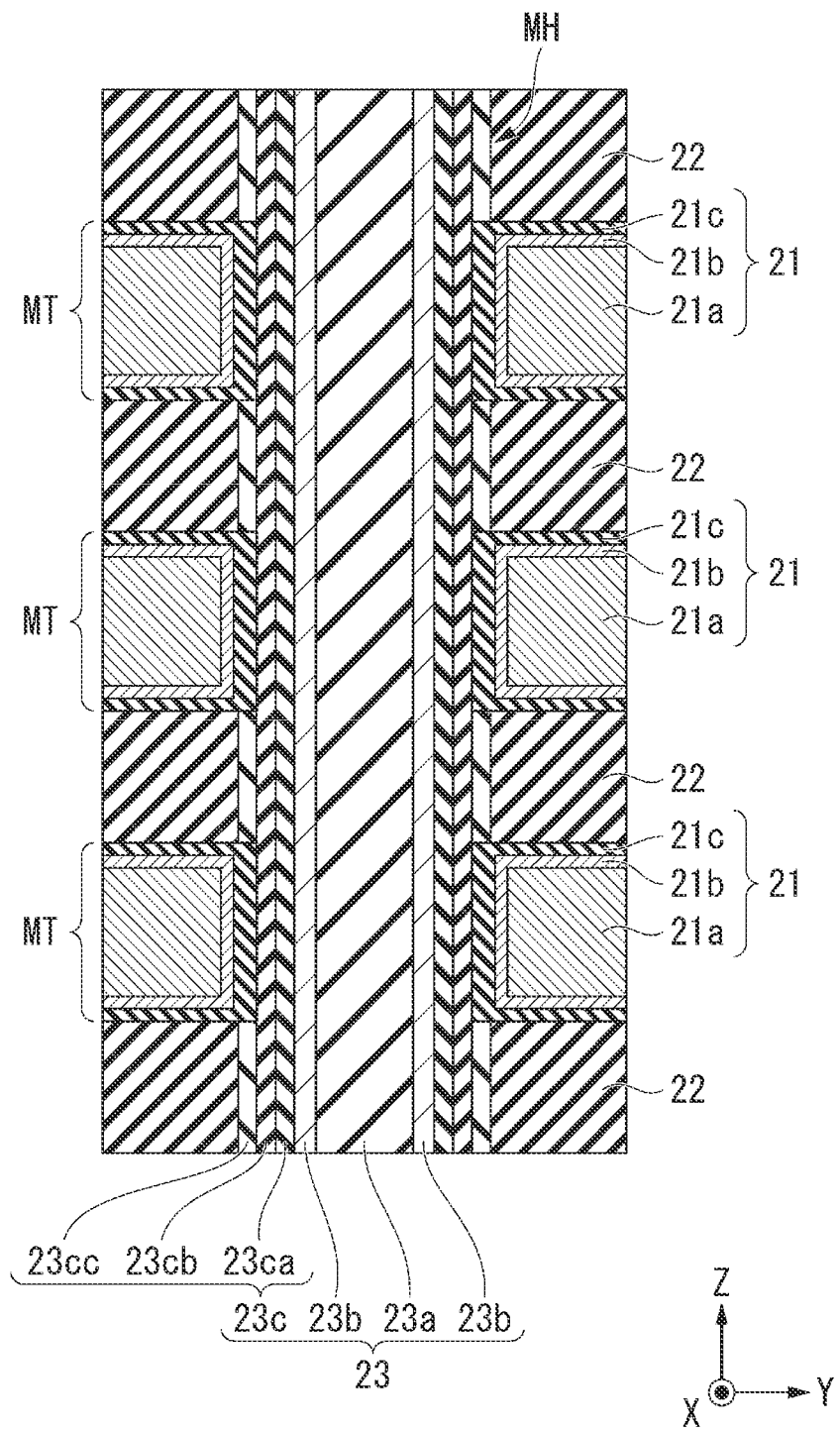
FIG. 5 is a cross-sectional view in which the vicinity of a columnar shape body of the semiconductor storage device according to the first embodiment is enlarged and cut along the Z direction.
Figure 6:
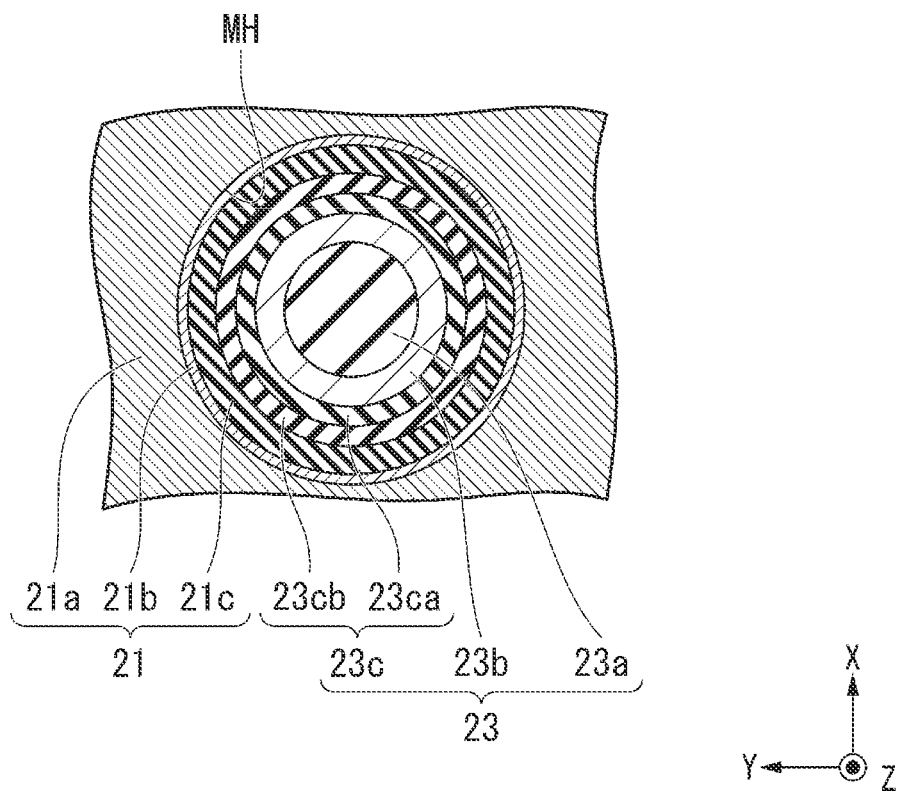
FIG. 6 is a cross-sectional view in which the vicinity of the columnar shape body of the semiconductor storage device according to the first embodiment is enlarged and cut along a conductive layer.

FIG. 5 is a cross-sectional view in which the vicinity of the columnar shape body 23 of the semiconductor storage device 100 according to the first embodiment is enlarged and cut along the Z direction. FIG. 6 is a cross-sectional view in which the vicinity of the columnar shape body 23 of the semiconductor storage device 100 according to the first embodiment is enlarged and cut along the conductive layer 21.

Each of the columnar shape bodies 23 is formed in a memory hole MH. Each of the columnar shape bodies 23 includes a core 23a, a semiconductor body 23b, and a memory film 23c in this order from the inside. The columnar shape body 23 is, for example, a circle or an ellipse in a plan view from the Z direction.

The core 23a extends in the Z direction and has a columnar shape. The core 23a contains, for example, a silicon oxide. The core 23a is located inside the semiconductor body 23b.

The semiconductor body 23b extends in the Z direction. The semiconductor body 23b covers an outer surface of the core 23a. The semiconductor body 23b contains, for example, silicon. Silicon is, for example, polysilicon obtained by crystallizing amorphous silicon. The semiconductor body 23b is a flow path for carriers in the columnar shape body 23.

The memory film 23c extends in the Z direction. The memory film 23c covers an outer surface of the semiconductor body 23b. The memory film 23c is provided between the inner surface of the memory hole MH and the outer surface of the semiconductor body 23b. The memory film 23c includes, for example, a tunnel insulating film 23ca, a charge storage film 23cb, and a cover insulating film 23cc.

The tunnel insulating film 23ca is located between the charge storage film 23cb and the semiconductor body 23b. The tunnel insulating film 23ca contains, for example, a silicon oxide, or a silicon oxide and a silicon nitride. The tunnel insulating film 23ca is a potential barrier provided between the semiconductor body 23b and the charge storage film 23cb.

The charge storage film 23cb is located between the respective conductive layer 21 and the tunnel insulating film 23ca. The charge storage film 23cb contains, for example, a silicon nitride. A portion where the charge storage film 23cb and each of the plurality of conductive layers 21 intersect with each other functions as a memory cell transistor MC. The memory cell transistor MC stores data depending on the presence or absence of electric charge at a portion (charge storage portion) where the charge storage film 23cb intersects the plurality of conductive layers 21 or the amount of stored electric charge.

The cover insulating film 23cc is located between the respective insulating layers 22 and the charge storage film 23cb. The cover insulating film 23cc may be omitted. The cover insulating film 23cc contains, for example, a silicon oxide. The cover insulating film 23cc protects the charge storage film 23cb from etching during processing.

Further, each of the conductive layers 21 may include a conductive layer 21a, a barrier film 21b, and a block insulating film 21c. The barrier film 21b improves the adhesion between the conductive layer 21a and the block insulating film 21c. When the conductive layer 21a is tungsten, for example, the barrier film 21b is titanium nitride, or a stacked structure film of titanium nitride and titanium. The block insulating film 21c prevents back tunneling. The back tunneling is a phenomenon in which electric charge is returned from the conductive layer 21 to the memory film 23c. The block insulating film 21c is, for example, a silicon oxide film, a metal oxide film, and a stacked structure film in which a plurality of insulating films are stacked. An example of a metal oxide is an aluminum oxide.

The circuit area 3 (see FIG. 4) is an area having a circuit for controlling the memory cell transistor MC in the memory area 2. The circuit area 3 includes a plurality of transistors 30 and a plurality of contacts 35. The contact 35 connects the transistor 30 and the wiring that controls the transistor 30. The contact 35 includes a contact 35A that is connected to the diffusion layer 31 of the transistor 30 and a contact 35B that is connected to the gate electrode 34 of the transistor 30. There are element isolation areas 41 and 42 (STI: Shallow Trench Isolation) between the plurality of transistors 30.

The transistor 30 is used, for example, in the above-mentioned sense amplifier module 106 and the like. The transistor 30 includes, for example, a high breakdown voltage transistor and a low breakdown voltage transistor. The high breakdown voltage transistor is intended to handle a high voltage of, for example, 20 V or more. The low breakdown voltage transistor is intended to handle a lower voltage than the high breakdown voltage transistor.

Figure 7:
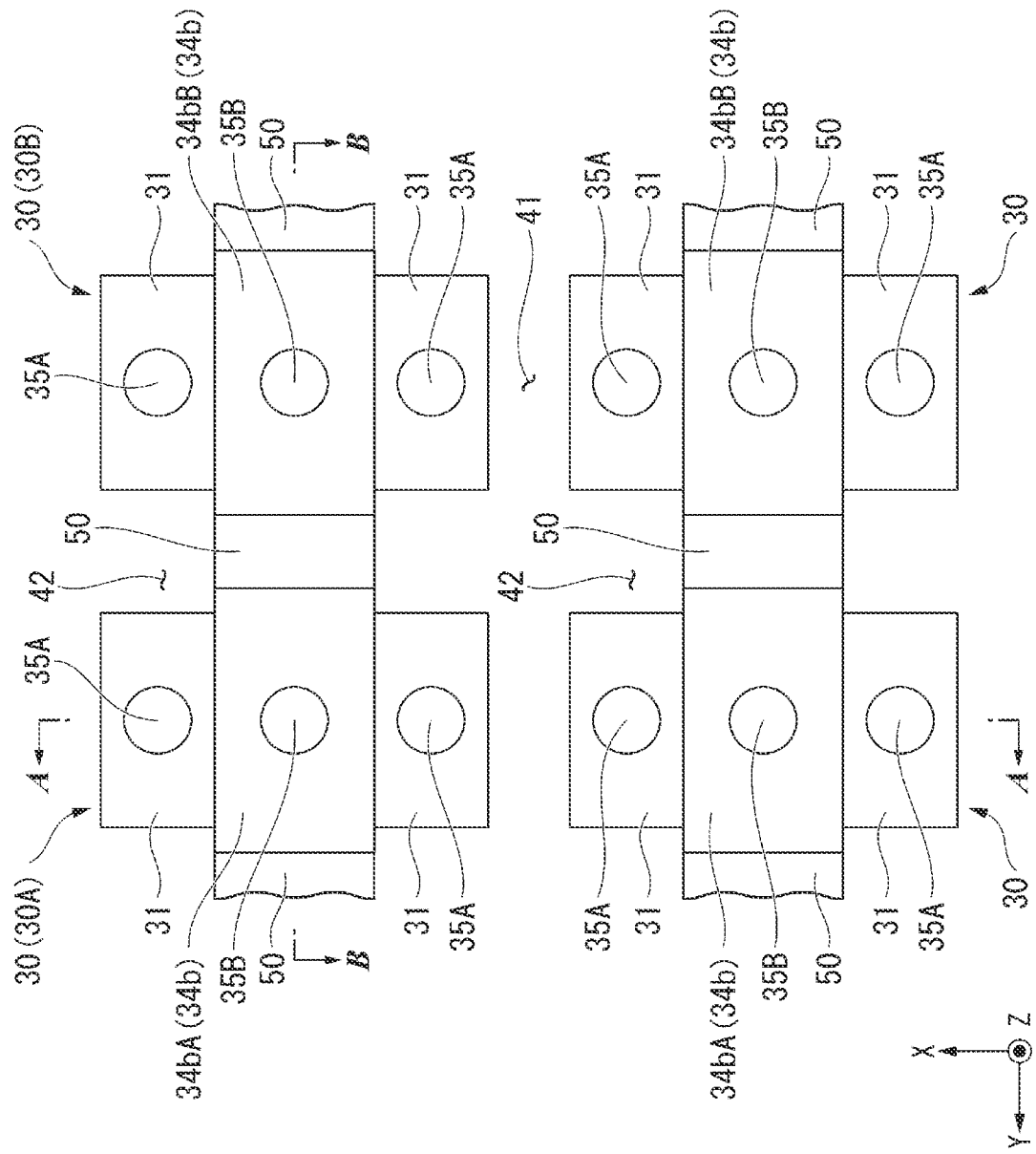
FIG. 7 is a plan view of the vicinity of a transistor in a circuit area of the semiconductor storage device according to the present embodiment.
Figure 8:
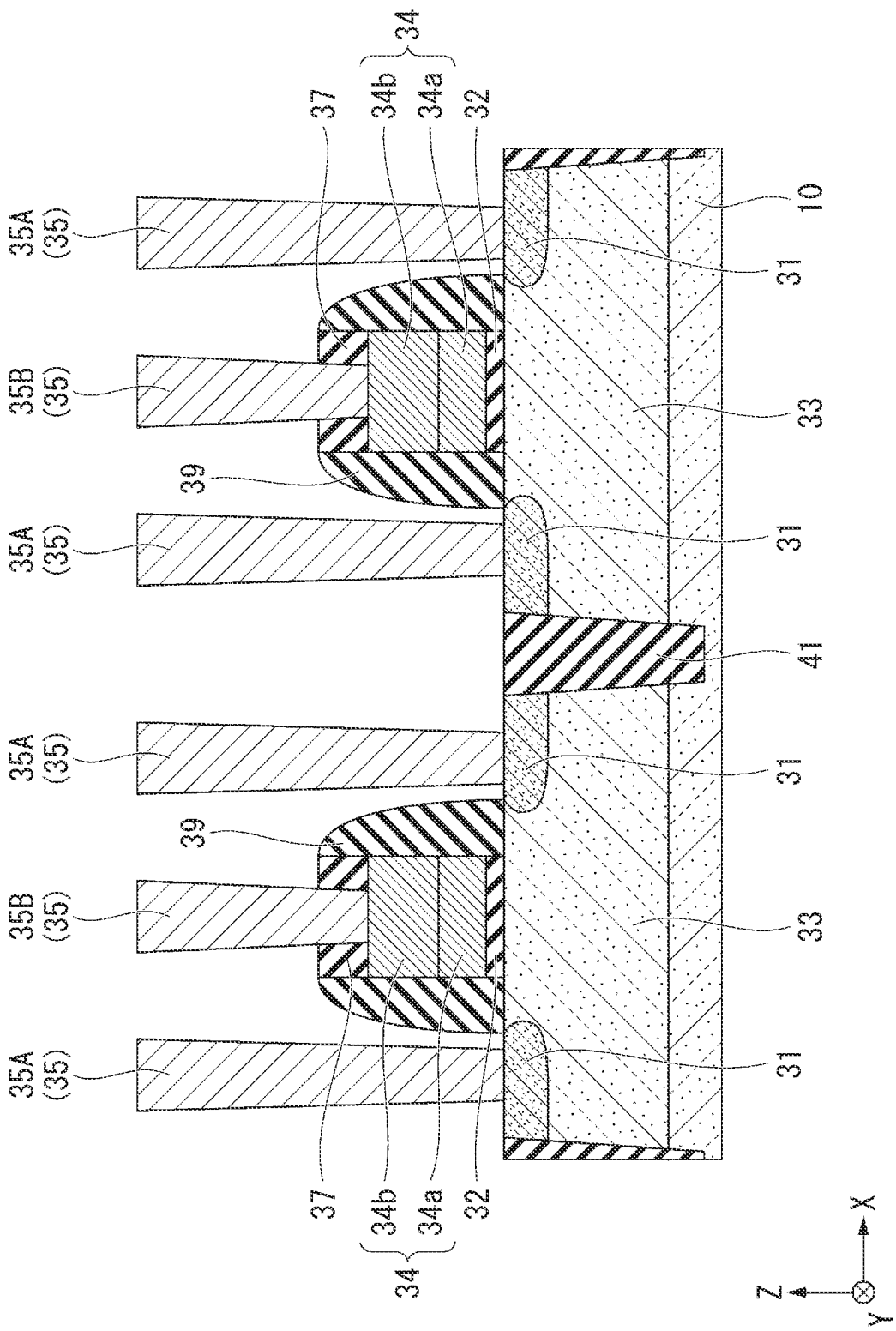
FIG. 8 is a cross-sectional view of the vicinity of the transistor in the circuit area of the semiconductor storage device according to the present embodiment.
Figure 9:
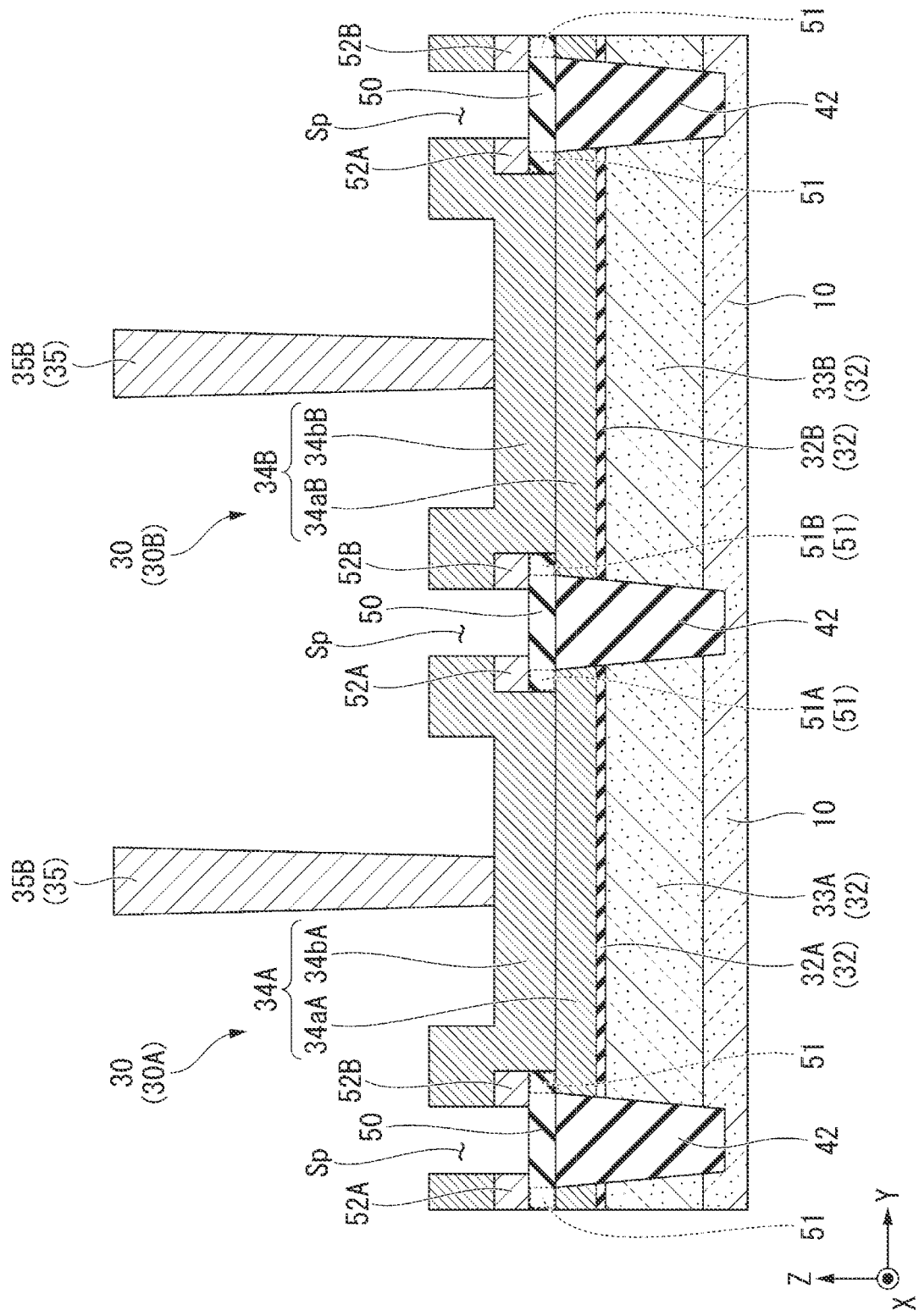
FIG. 9 is another cross-sectional view of the vicinity of a transistor in the circuit area of the semiconductor storage device according to the present embodiment.

FIG. 7 is a plan view of the vicinity of the transistor 30 in a circuit area 3 of the semiconductor storage device 100 according to the present embodiment. FIGS. 8 and 9 are cross-sectional views of the vicinity of the transistor 30 in the circuit area 3 of the semiconductor storage device 100 according to the present embodiment. FIG. 8 shows a cross section taken along the line A-A in FIG. 7, and FIG. 9 shows a cross section taken along the line B-B in FIG. 6.

The transistors 30 are arranged in a matrix shape, for example. Each of the transistors 30 includes, for example, two diffusion layers 31, a well region 33, a gate insulating layer 32, a gate electrode 34, a contact 35, an insulating layer 37, and an insulating side wall 39.

The well region 33 is formed in the semiconductor substrate 10. The well region 33 is a P-type well region or an N-type well region. The well region 33 is divided by the element isolation area 41 in the X direction. The well region 33 is divided by the element isolation area 42 in the Y direction. Hereinafter, one divided by the element isolation area 42 in the Y direction may be referred to as a well region 33A, and the other may be referred to as a well region 33B. For example, the well region 33A is a first well region and the well region 33B is a second well region. The element isolation areas 41 and 42 are insulators filled in the grooves formed in the semiconductor substrate 10, and are, for example, silicon oxide. The element isolation areas 41 and 42 divide the transistors 30 adjacent to each other. Hereinafter, one of the transistors 30 adjacent to each other in the Y direction may be referred to as a first transistor 30A, and the other may be referred to as a second transistor 30B.

The two diffusion layers 31 are separated from each other in the X direction and sandwich the gate insulating layer 32 and the gate electrode 34 in a plan view from the Z direction. Each of the diffusion layers 31 is a source or a drain of the transistor 30. Each of the diffusion layers 31 is a semiconductor containing a dopant that serves as a donor or acceptor. When the diffusion layer 31 is a p-type, the diffusion layer 31 is made of, for example, boron-doped silicon. When the diffusion layer 31 is an n-type, the diffusion layer 31 is made of, for example, phosphorus-doped silicon.

The gate insulating layer 32 is on the well region 33 that is provided between the two diffusion layers 31. The gate insulating layer 32 includes, for example, a stacked structure of silicon oxide and silicon nitride. Among the gate insulating layers 32, a gate insulating layer 32 belonging to the first transistor 30A is referred to as a gate insulating layer 32A, and a gate insulating layer 32 belonging to the second transistor 30B is referred to as a gate insulating layer 32B. The gate insulating layer 32A is an example of a first gate insulating layer. The gate insulating layer 32B is an example of a second gate insulating layer.

The gate electrode 34 includes a gate electrode 34a and a gate electrode 34b in this order from the semiconductor substrate 10 side. The gate electrode 34 is above the well region 33 provided between the two diffusion layers 31 and is on the gate insulating layer 32. The gate electrode 34a is on the gate insulating layer 32, and the gate electrode 34b is on the gate electrode 34a. The gate electrode 34a includes a semiconductor. The gate electrode 34a is made of, for example, polysilicon. The gate electrode 34b includes metal. The gate electrode 34b is, for example, tungsten.

Further, among the gate electrodes 34a, a gate electrode 34a belonging to the first transistor 30A is referred to as a gate electrode 34aA, and a gate electrode 34a belonging to the second transistor 30B is referred to as a gate electrode 34aB. The gate electrode 34aA is an example of a first gate electrode. The gate electrode 34aB is an example of a third gate electrode. Further, among the gate electrodes 34b, a gate electrode 34b belonging to the first transistor 30A is referred to as a gate electrode 34bA, and a gate electrode 34b belonging to the second transistor 30B is referred to as a gate electrode 34bB. The gate electrode 34bA is an example of a second gate electrode. The gate electrode 34bB is an example of a fourth gate electrode.

The insulating layer 37 covers an upper surface of the gate electrode 34. The insulating side wall 39 covers a side surface of the gate electrode 34. The insulating layer 37 and the insulating side wall 39 are, for example, silicon oxides.

Figure 10:
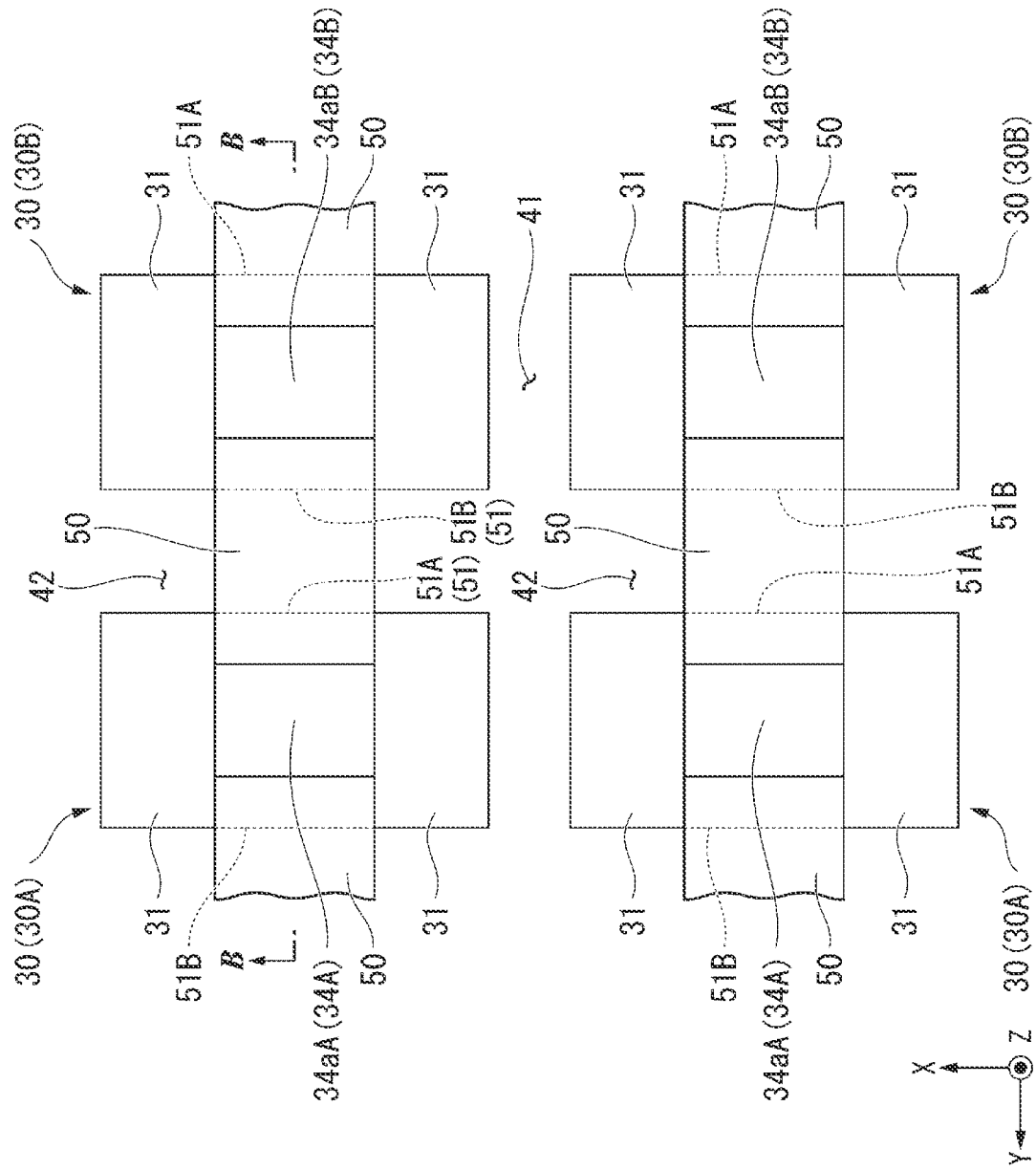
FIG. 10 is a plan view of an insulating layer and a semiconductor layer of a transistor in the circuit area of the semiconductor storage device according to the present embodiment.

An insulating layer 50 is provided on the element isolation area 42 (see FIG. 9). The insulating layer 50 is an example of a first insulating layer. FIG. 10 is a view of the upper surfaces of the insulating layer 50 and the gate electrode 34a viewed from the Z direction. A portion of the insulating layer 50 protrudes in the Y direction from the element isolation area 42 when viewed from the Z direction. A portion of the insulating layer 50 that protrudes from the element isolation area 42 in the Y direction when viewed from the Z direction is referred to as a protrusion portion 51. The insulating layer 50 is made of, for example, silicon oxide. A portion of the insulating layer 50 overlaps with the gate electrode 34aA and the gate electrode 34aB when viewed from the Z direction. The portion of the insulating layer 50 that overlaps with the gate electrode 34aA when viewed from the Z direction is referred to as a protrusion portion 51A, and the portion that overlaps with the gate electrode 34aB is referred to as a protrusion portion 51B. The protrusion portion 51A is an example of a first protrusion portion, and the protrusion portion 51B is an example of a second protrusion portion.

On the insulating layer 50, for example, semiconductor layers 52A and 52B are provided (see FIG. 9). The semiconductor layer 52A is an example of a first semiconductor layer. The semiconductor layer 52B is an example of a second semiconductor layer. The semiconductor layers 52A and 52B are provided respectively on the protrusion portion 51. The semiconductor layer 52A is provided on the protrusion portion 51A, and the semiconductor layer 52B is provided on the protrusion portion 51B. The semiconductor layer 52A is provided between the protrusion portion 51A and the gate electrode 34bA. The semiconductor layer 52B is provided between the protrusion portion 51B and the gate electrode 34bB. There is a space Sp between the semiconductor layer 52A and the semiconductor layer 52B extending in the X direction. The space Sp is formed when the gate electrode 34 is divided. The semiconductor layers 52A and 52B are made of, for example, polysilicon.

A portion of the gate electrode 34bA is also formed on the insulating layer 50 and the semiconductor layer 52A. The gate electrode 34bA is provided on the protrusion portion 51A and covers the protrusion portion 51A. A portion of the gate electrode 34bB is also formed on the insulating layer 50 and the semiconductor layer 52B. The gate electrode 34bB is provided on the protrusion portion 51B and covers the protrusion portion 51B. There is a space Sp between the gate electrode 34bA and the gate electrode 34bB, which are electrically separated from each other. Although not shown, the space Sp is filled with an insulator such as silicon nitride or silicon oxide. A portion of the gate electrode 34bA protrudes in the Y direction from the boundary between the element isolation area 42 and the gate electrode 34aA. A portion of the gate electrode 34bB protrudes in the Y direction from the boundary between the element isolation area 42 and the gate electrode 34aB. As a result, when viewed from the Z direction, a portion of the gate electrodes 34bA and 34bB overlaps with the element isolation area 42.

The circuit area 3 also includes elements other than the transistor 30. The circuit area 3 includes, for example, a capacitive element (e.g., a capacitor) 60 and a resistance element (e.g., a resistor) 70.

Figure 11:
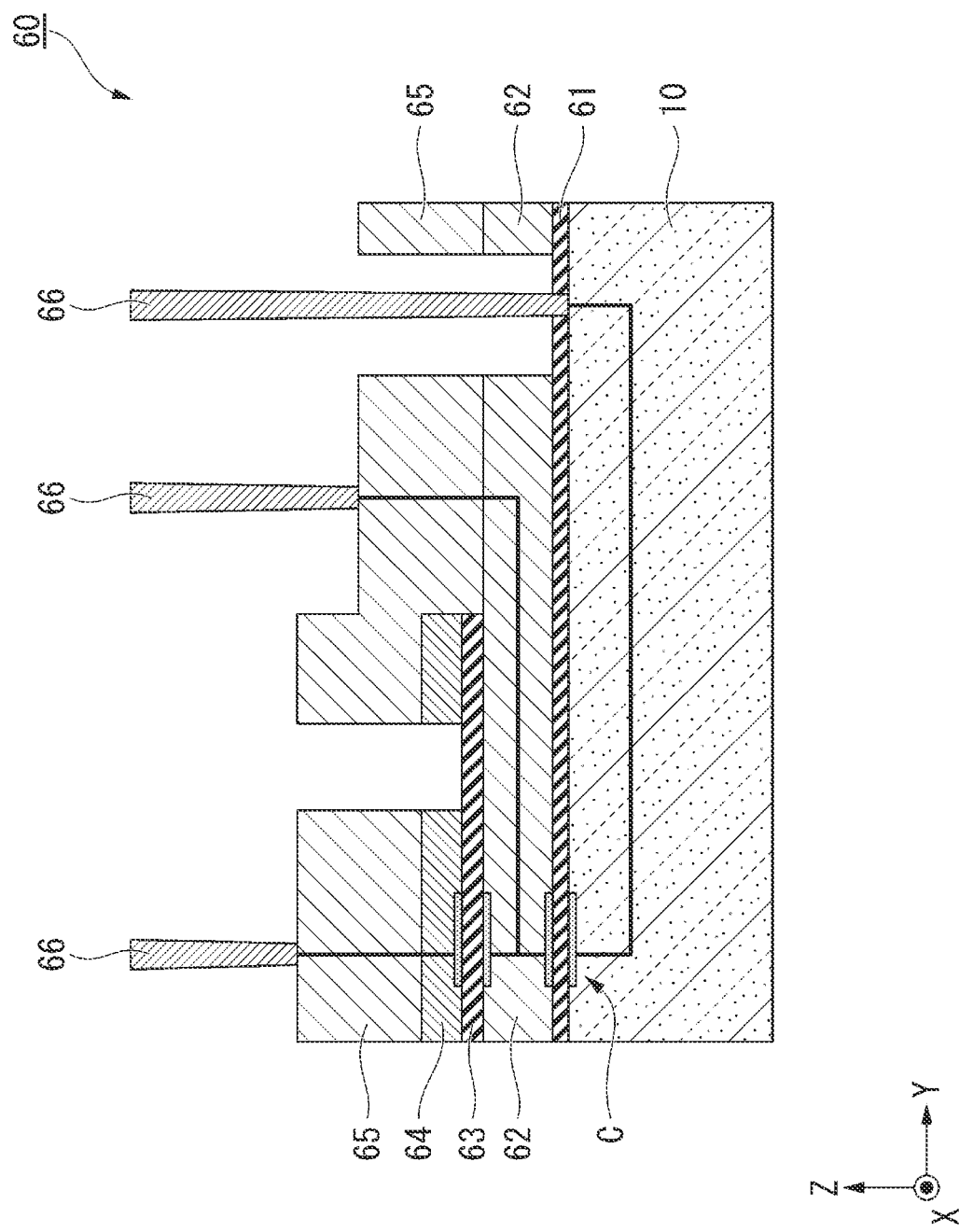
FIG. 11 is a cross-sectional view of a capacitive element in the circuit area of the semiconductor storage device according to the present embodiment.

FIG. 11 is a cross-sectional view of the capacitive element 60 in the circuit area 3 of the semiconductor storage device 100 according to the present embodiment. The capacitive element 60 is formed on the same semiconductor substrate 10 as the transistor 30. The capacitive element 60 includes an insulating layer 61, a semiconductor layer 62, an insulating layer 63, a semiconductor layer 64, a metal layer 65, and a contact 66. The insulating layer 61 is an example of a second insulating layer. The semiconductor layer 62 is an example of a third semiconductor layer. The insulating layer 63 is an example of a third insulating layer. The semiconductor layer 64 is an example of a fourth semiconductor layer. The metal layer 65 is an example of a second metal layer.

The insulating layer 61 is provided on the semiconductor substrate 10. The semiconductor layer 62 is provided on the insulating layer 61. A portion of the semiconductor layer 62 has an opening, and a contact 66 reaching the semiconductor substrate 10 is formed in the opening. The insulating layer 63 is provided on a portion of the semiconductor layer 62. The semiconductor layer 64 is provided on the insulating layer 63. The metal layer 65 covers the semiconductor layers 62 and 64.

The insulating layer 61 interposed between the semiconductor substrate 10 that is connected to the contact 66 and the semiconductor layer 62 functions as a capacitor C. Further, the insulating layer 63 interposed between the semiconductor layer 62 that is connected to the contact 66 and the semiconductor layer 64 functions as a capacitor C. When the potentials of the respective contacts 66 are different, electric charges are stored in the capacitor C, and capacitance is generated. The capacitive element 60 can store electric charges by the insulating layer 61 and the insulating layer 63 and can discharge the electric charges as needed.

The insulating layer 61 is formed at the same time as the gate insulating layer 32 and is made of the same material. The semiconductor layer 62 is formed at the same time as the gate electrode 34a and is made of the same material. The insulating layer 63 is formed at the same time as the insulating layer 50 and is made of the same material. The semiconductor layer 64 is formed at the same time as the semiconductor layers 52A and 52B, and is made of the same material. The metal layer 65 is formed at the same time as the gate electrode 34b and is made of the same material.

Figure 12:
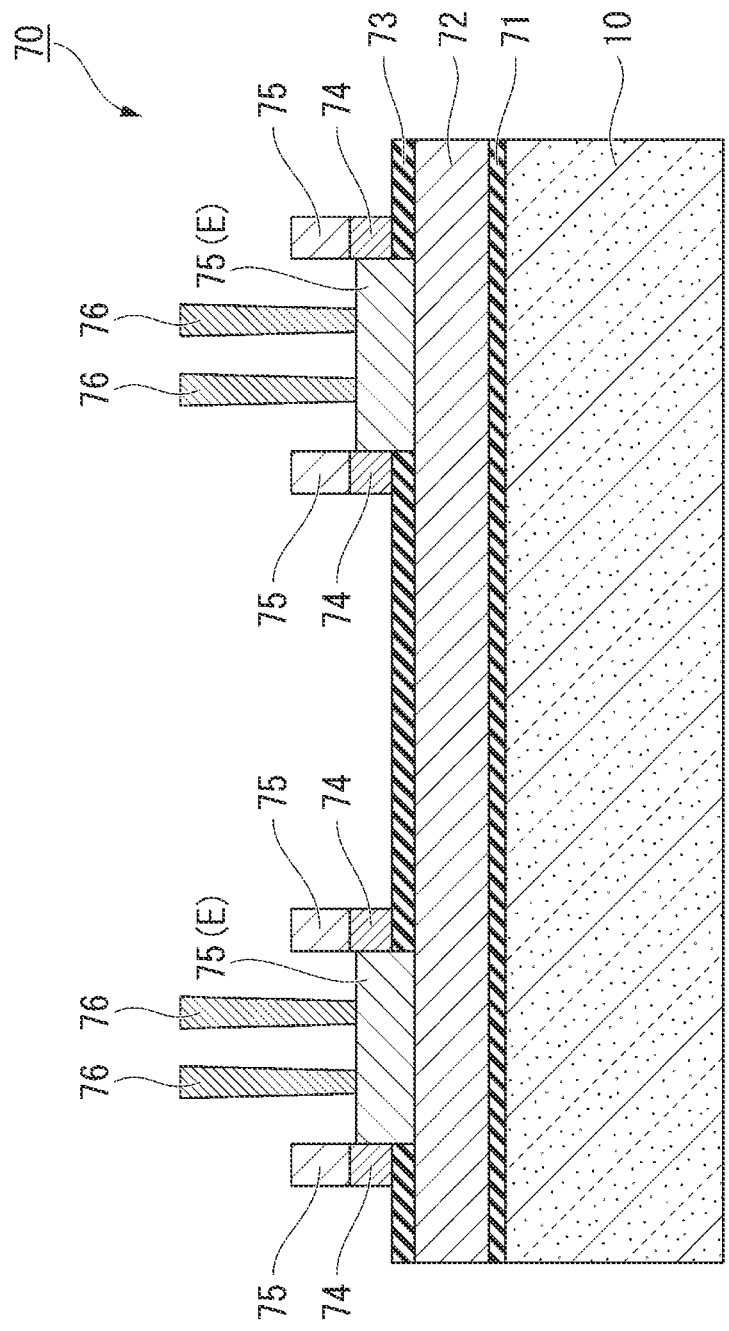
FIG. 12 is a cross-sectional view of a resistance element in the circuit area of the semiconductor storage device according to the present embodiment.

FIG. 12 is a cross-sectional view of the resistance element 70 in the circuit area 3 of the semiconductor storage device 100 according to the present embodiment. The resistance element 70 is formed on the same semiconductor substrate 10 as the transistor 30. The resistance element 70 includes an insulating layer 71, a semiconductor layer 72, an insulating layer 73, a semiconductor layer 74, a metal layer 75, and a contact 76. The semiconductor layer 72 is an example of a fifth semiconductor layer. The insulating layer 73 is an example of a fourth insulating layer. A portion of the metal layer 75 becomes the electrode E.

The insulating layer 71 is provided on the semiconductor substrate 10. The semiconductor layer 72 is provided on the insulating layer 71. The semiconductor layer 72 is, for example, wiring extending in the Y direction. The insulating layer 73 is provided on the semiconductor layer 72. An opening is formed in a portion of the insulating layer 73. The semiconductor layer 74 is on a portion of the insulating layer 73. The metal layer 75 is provided on the semiconductor layer 72 that is exposed in the opening and the semiconductor layer 74. The metal layer 75 that fills the inside of the opening serves as an electrode E.

In the resistance element 70 shown in FIG. 12, the semiconductor layer 72 is electrically connected between the two electrodes E. The semiconductor layer 72 connecting between the two electrodes E is a resistor. When the semiconductor layer 72 functions as a resistor, the resistance element 70 becomes a resistance element that exhibits a constant resistance value.

The insulating layer 71 is formed at the same time as the gate insulating layer 32 and is made of the same material. The semiconductor layer 72 is formed at the same time as the gate electrode 34a and is made of the same material. The insulating layer 73 is formed at the same time as the insulating layer 50 and is made of the same material. The semiconductor layer 74 is formed at the same time as the semiconductor layers 52A and 52B, and is made of the same material. The metal layer 75 is formed at the same time as the gate electrode 34b and is made of the same material.

Next, a method for manufacturing the circuit area 3 of the semiconductor storage device 100 according to the first embodiment will be described. FIGS. 13 to 18 are diagrams showing an example of a method for manufacturing the circuit area 3 of the semiconductor storage device 100. FIGS. 13 to 18 are enlarged views of the vicinity of the transistor 30. The upper figure is a plan view viewed from the Z direction, and the lower figure is a YZ cross-sectional view.

Figure 13:
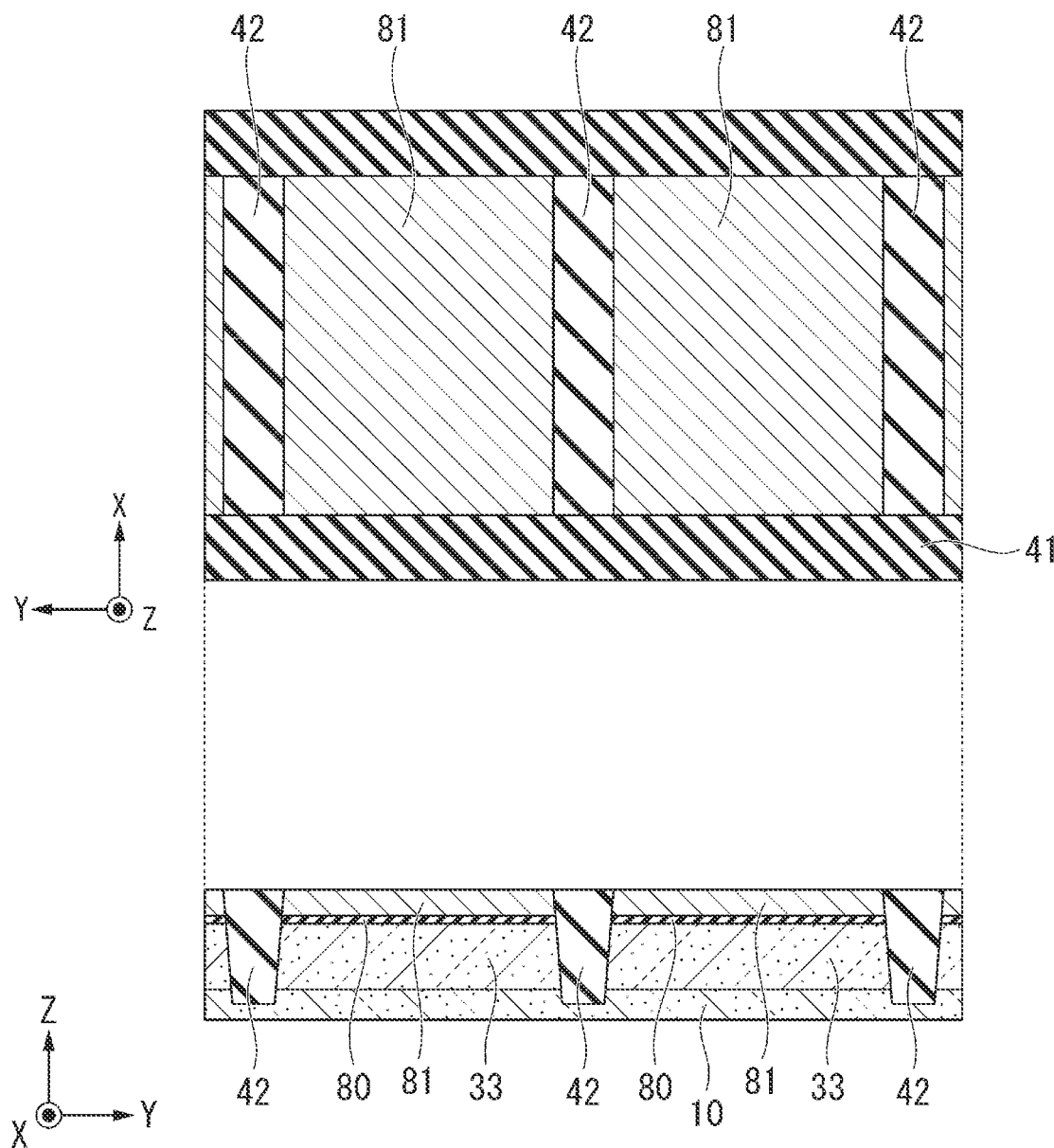
FIG. 13 is a diagram showing an example of a method for manufacturing a circuit area of a semiconductor storage device.

First, the insulating layer 80 and the semiconductor layer 81 are stacked on the entire surface of the semiconductor substrate 10 on which the well region 33 is formed. When the capacitive element 60 and the resistance element 70 are present in the circuit area 3, the insulating layer 80 also serves as the insulating layer 61 and the insulating layer 71, and the semiconductor layer 81 also serves as the semiconductor layer 62 and the semiconductor layer 72. Next, as shown in FIG. 13, element isolation areas 41 and 42 are formed at predetermined locations. The element isolation areas 41 and 42 may be manufactured by forming a groove from the semiconductor layer 81 to the semiconductor substrate 10 and filling the inside of the groove with an insulator.

Figure 14:
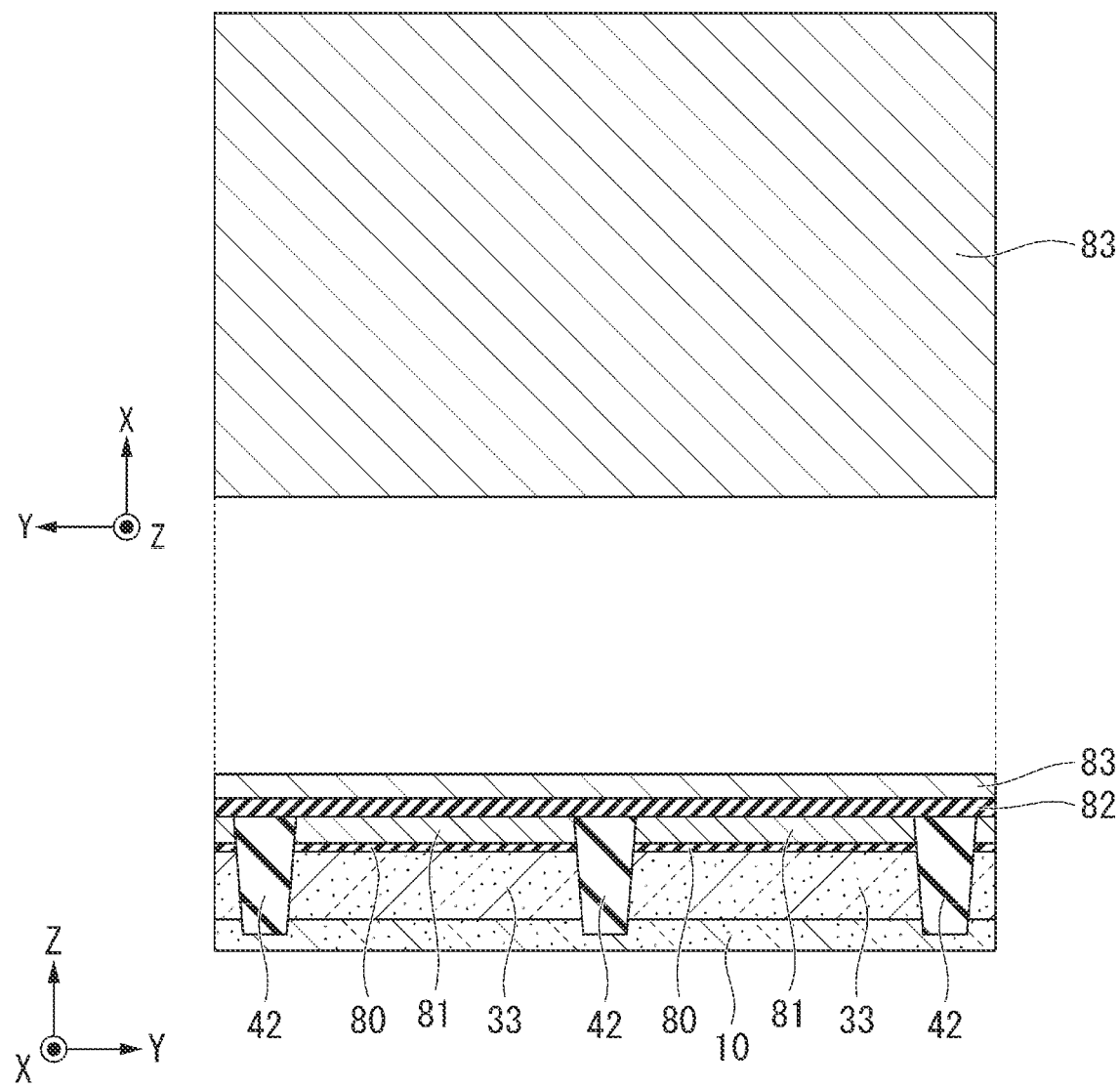
FIG. 14 is a diagram showing an example of a method for manufacturing a circuit area of a semiconductor storage device.

Next, as shown in FIG. 14, the insulating layer 82 and the semiconductor layer 83 are formed on the entire surface of the semiconductor layer 81 and the element isolation areas 41 and 42. When the capacitive element 60 and the resistance element 70 are present in the circuit area 3, the insulating layer 82 also serves as the insulating layer 63 and the insulating layer 73, and the semiconductor layer 83 also serves as the semiconductor layer 64 and the semiconductor layer 74. That is, the insulating layer 82, the insulating layer 63, and the insulating layer 73 are continuous layers formed at the same time, and the semiconductor layer 83, the semiconductor layer 64, and the semiconductor layer 74 are continuous layers formed at the same time.

Figure 15:
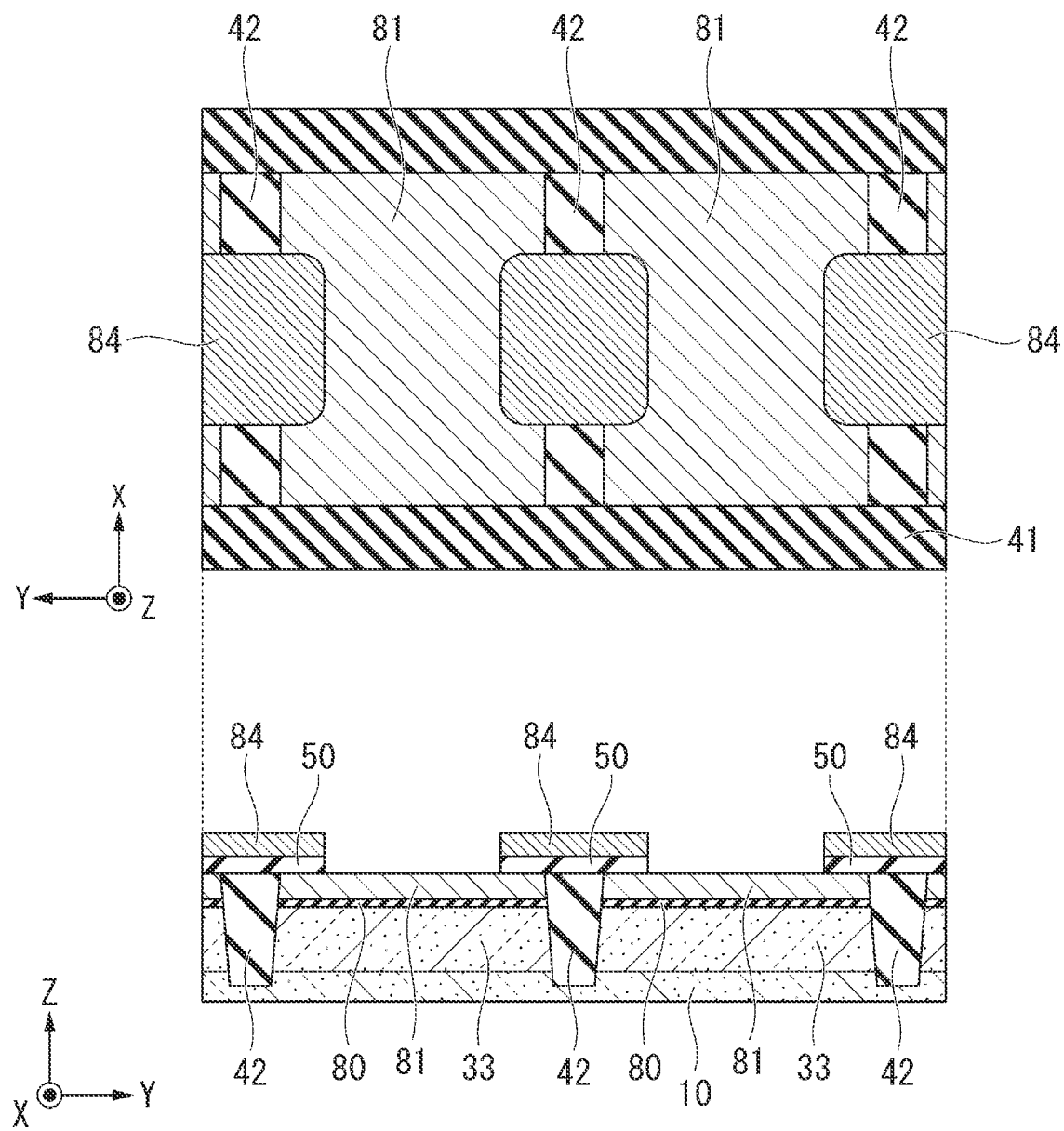
FIG. 15 is a diagram showing an example of a method for manufacturing a circuit area of a semiconductor storage device.

Next, as shown in FIG. 15, unnecessary portions of the insulating layer 82 and the semiconductor layer 83 are removed by reactive ion etching (RIE) or the like. The insulating layer 82 and the semiconductor layer 83 are left so as to straddle the element isolation area 42. The insulating layer 82 becomes the insulating layer 50, and the semiconductor layer 83 becomes the semiconductor layer 84.

Figure 16:
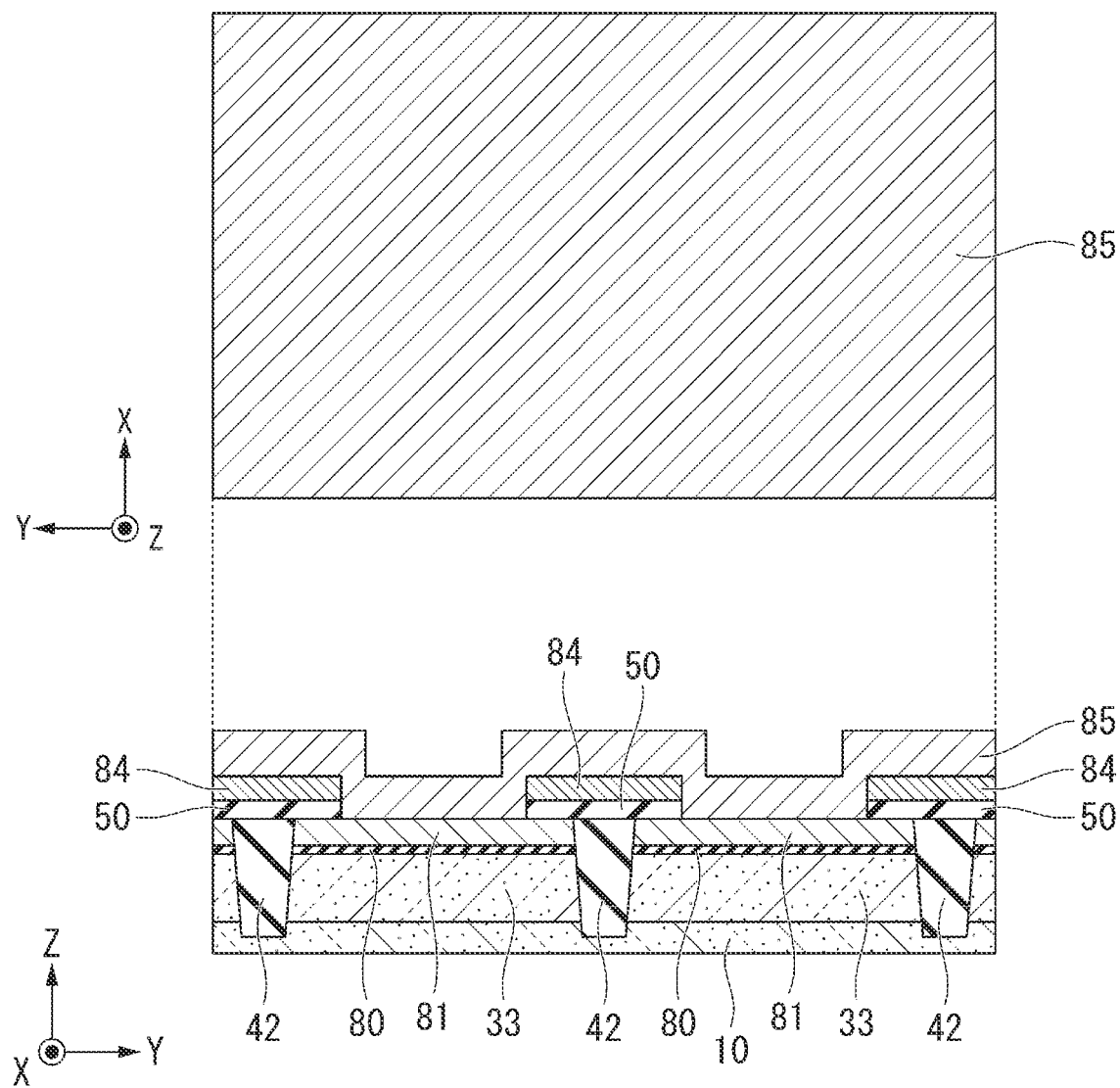
FIG. 16 is a diagram showing an example of a method for manufacturing a circuit area of a semiconductor storage device.

Next, as shown in FIG. 16, a metal layer 85 is formed on the entire surface of the semiconductor layer 81 and the semiconductor layer 84. When the capacitive element 60 and the resistance element 70 are present in the circuit area 3, the metal layer 85 also serves as the metal layer 65 and the metal layer 75. That is, the metal layer 85, the metal layer 65, and the metal layer 75 are continuous layers formed at the same time.

Figure 17:
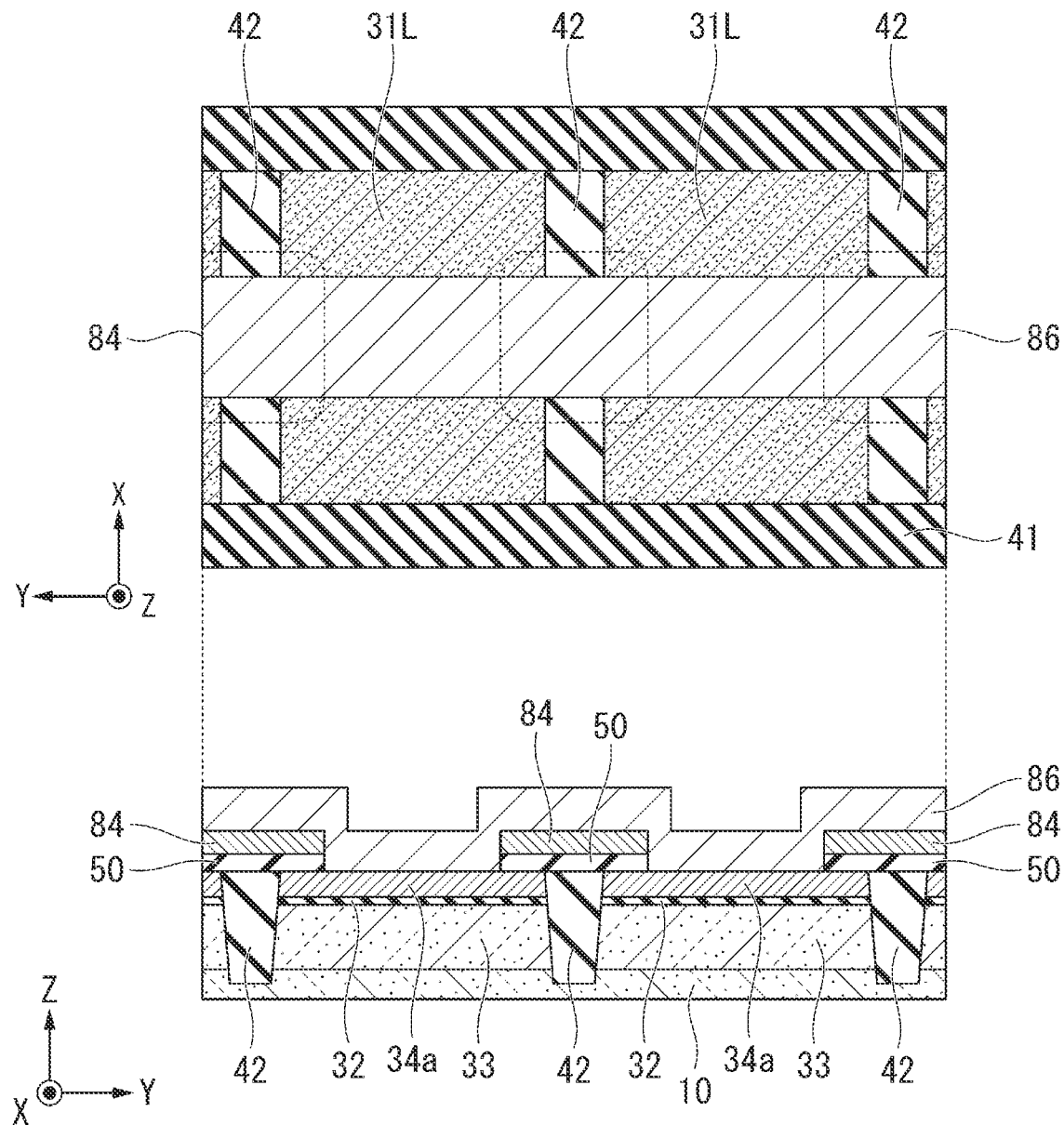
FIG. 17 is a diagram showing an example of a method for manufacturing a circuit area of a semiconductor storage device.

Next, as shown in FIG. 17, unnecessary portions of the metal layer 85, the semiconductor layer 81, and the insulating layer 80 are removed by reactive ion etching. By removing these layers, a portion of the well region 33 of the semiconductor substrate 10 is exposed. At this time, in the capacitive element 60, processing for removing unnecessary portions of the metal layer 65 and the semiconductor layers 62 and 64 is performed at the same time. Further, also in the resistance element 70, processing for removing unnecessary portions of the semiconductor layer 74 and the metal layer 75 is performed at the same time, and an outer peripheral shape in the vicinity of the electrode E is formed. The metal layer 85 becomes a metal layer 86 extending in the Y direction by processing. The semiconductor layer 81 serves as a gate electrode 34a. The insulating layer 80 becomes a gate insulating layer 32. Next, by doping the exposed portion of the semiconductor substrate 10 with a carrier, that portion becomes the doped area 31L.

An insulating side wall 39 that covers the side surface of the metal layer 86 is formed (not shown). Thereafter, the carrier is further doped in the doped area 31L to form the diffusion layer 31.

Figure 18:
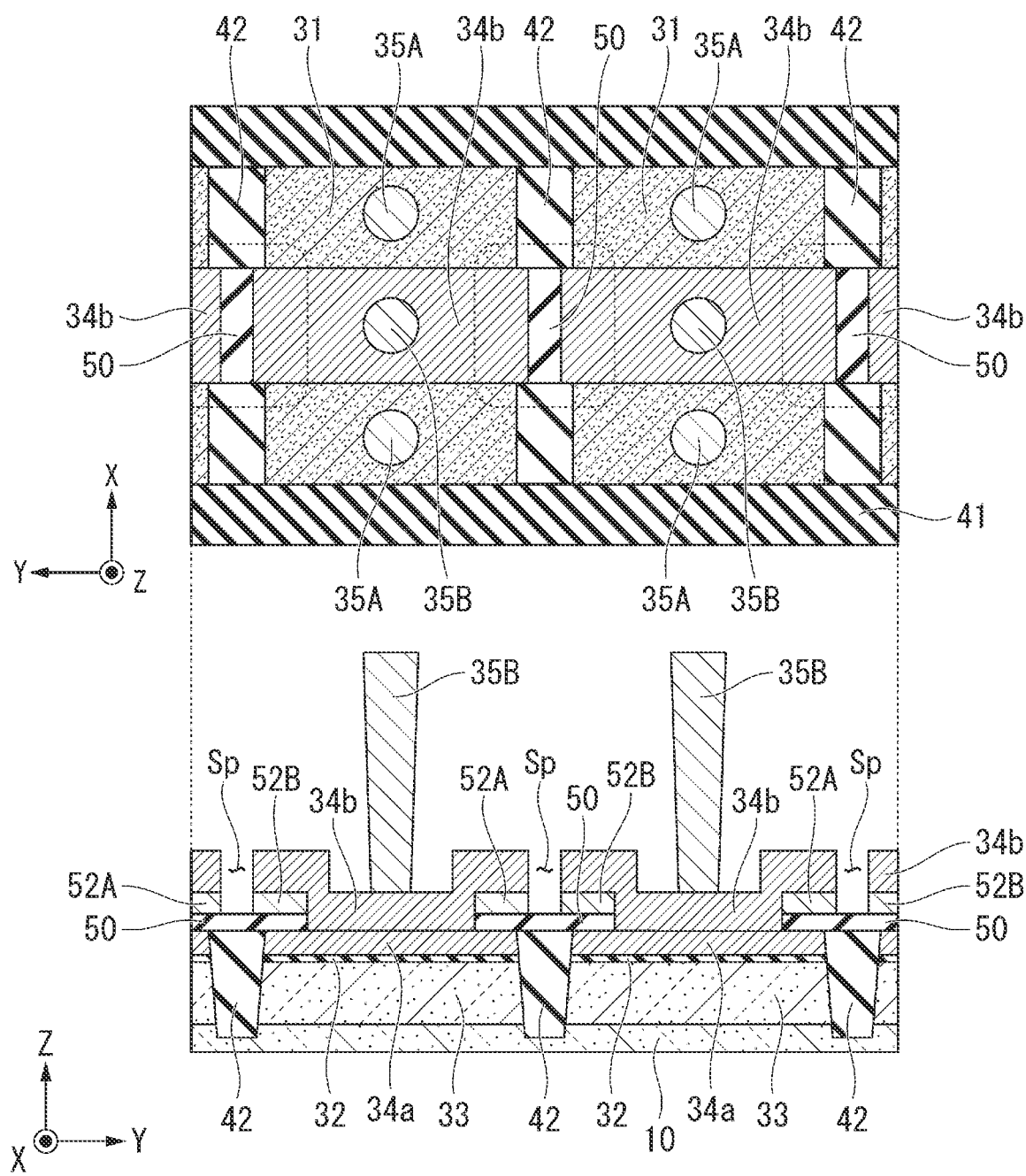
FIG. 18 is a diagram showing an example of a method for manufacturing a circuit area of a semiconductor storage device.

Next, as shown in FIG. 18, the metal layer 86 and the semiconductor layer 84 provided at locations overlapping with the element isolation area 42 are removed by reactive ion etching. The metal layer 86 is divided into a gate electrode 34b. The semiconductor layer 84 is divided into semiconductor layers 52A and 52B. By dividing the metal layer 86 and the semiconductor layer 84, the transistors 30 adjacent to each other in the Y direction are divided. Next, a contact 35A reaching the diffusion layer 31, and a contact 35B reaching the gate electrode 34b are formed.

Through the above processes, the transistor 30 in the circuit area 3 is manufactured. Further, the capacitive element 60 and the resistance element 70 may be manufactured at the same time as the transistor 30. The manufacturing process shown here is an example, and other processes may be inserted between each process.

According to the semiconductor storage device 100 according to the first embodiment, a distance between the transistors 30 adjacent to each other in the Y direction can be narrowed. This is because the insulating layer 50 having a portion protruding from the element isolation area 42 in the Y direction is provided on the element isolation area 42 so that the processing margin when the metal layer 86 is divided is widened. The processing accuracy when dividing the metal layer 86 is defined by the width of the insulating layer 50 in the Y direction and is not affected by the width of the element isolation area 42 in the Y direction. Therefore, the width of the element isolation area 42 in the Y direction can be narrowed, and as a result, the distance between the transistors 30 adjacent to each other in the Y direction is narrowed. When the distance between the transistors 30 adjacent to each other in the Y direction is narrowed, the number of transistors 30 that can be formed in the same area increases, and the integration property of the circuit area 3 can be improved. Further, the area of a sense amplifier or the like including a large number of transistors 30 can be reduced.

Figure 19:
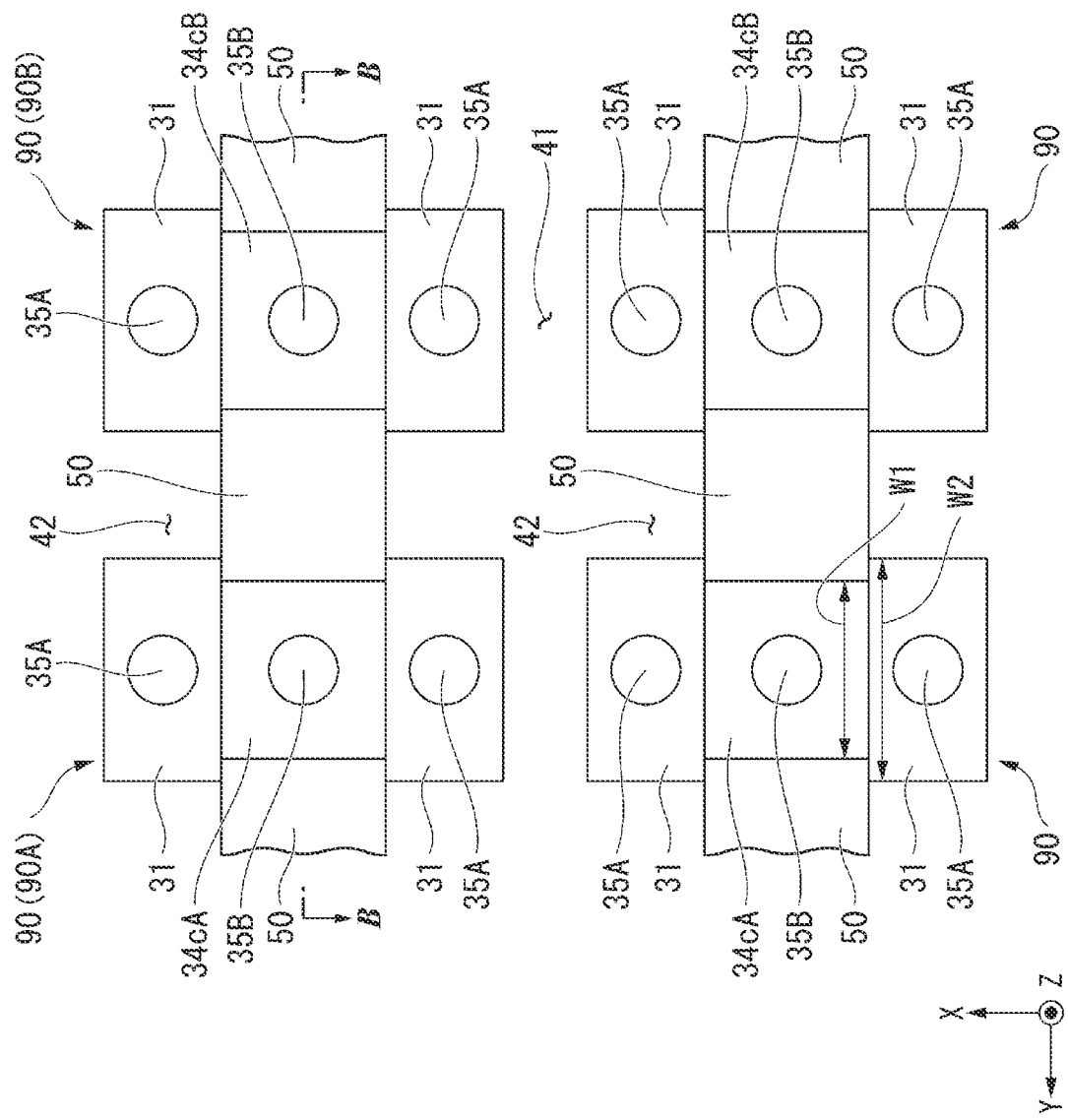
FIG. 19 is a plan view of the vicinity of a transistor in a circuit area of a semiconductor storage device according to a first modification example.
Figure 20:
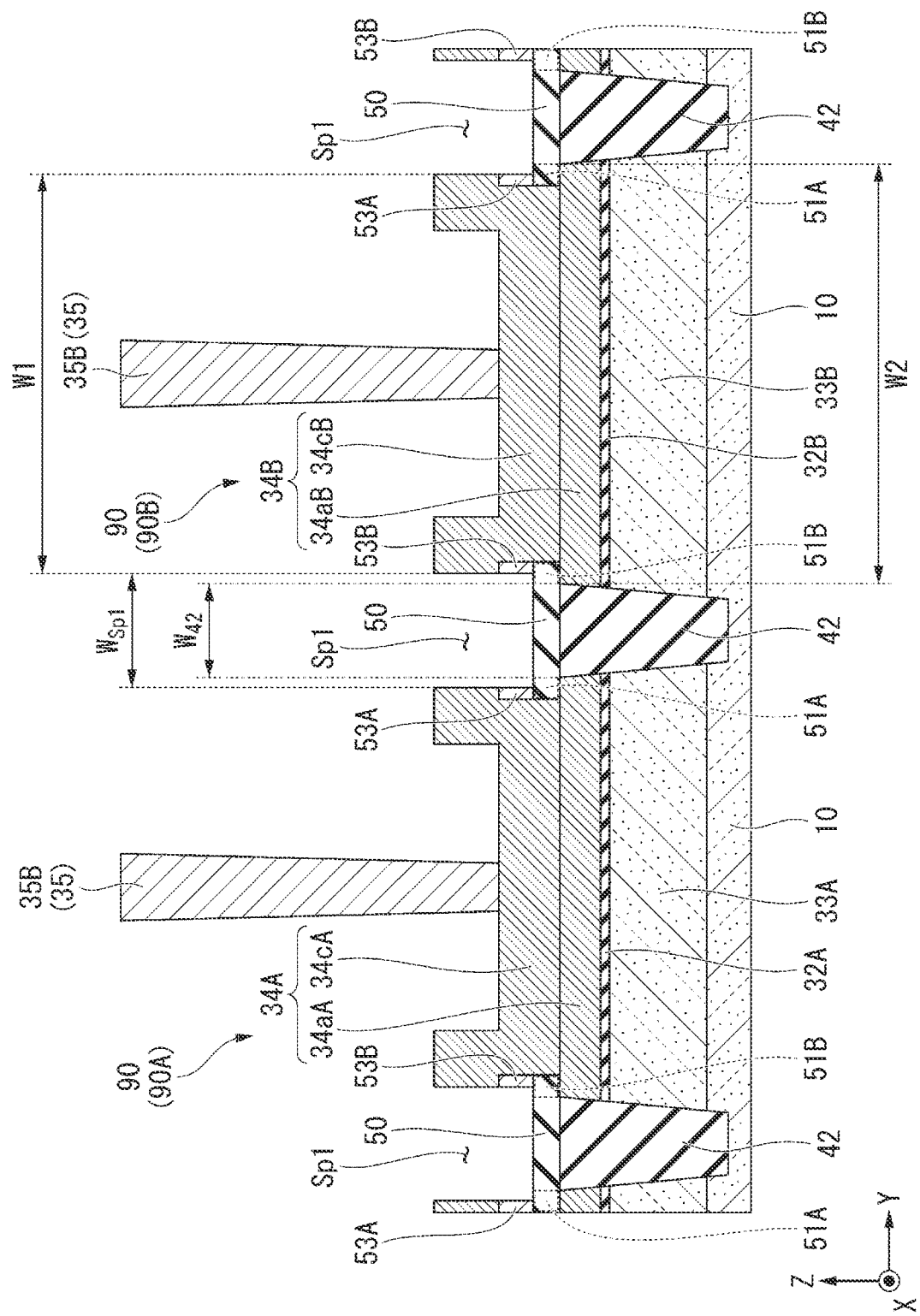
FIG. 20 is a cross-sectional view of the vicinity of the transistor in the circuit area of the semiconductor storage device according to the first modification example.

FIG. 19 is a plan view of the vicinity of the transistor 90 in the circuit area 3 of the semiconductor storage device 100 according to the first modification example. FIG. 20 is a cross-sectional view of the vicinity of the transistor 90 in the circuit area 3 of the semiconductor storage device 100 according to the first modification example. FIG. 20 shows a cross section taken along the line -B-B in FIG. 19. The shapes of the upper surfaces of the insulating layer 50 and the gate electrode 34a as viewed from the Z direction are the same as those in FIG. 10.

In the first modification example, the width of the space Sp1 between the gate electrode 34cA and the gate electrode 34cB adjacent to each other in the Y direction is different from that of the first embodiment. The width of the space Sp1 in the Y direction is wider than that of the space Sp. The width $W_{Sp1}$ of the space Sp1 in the Y direction is wider than, for example, the width $W_{42}$ of the element isolation area 42 in the Y direction. Although not shown, the space Sp1 is filled with an insulator such as silicon nitride or silicon oxide. The width of the gate electrodes 34cA and 34cB and the semiconductor layers 53A and 53B in the Y direction of the transistor 90 is different from that of the transistor 30 according to the first embodiment. Each of the gate electrodes 34cA and 34cB corresponds to the gate electrodes 34bA and 34bB of the first embodiment, and each of the semiconductor layers 53A and 53B corresponds to the semiconductor layers 52A and 52B of the first embodiment. In the first modification example, the same components as those in the first embodiment are designated by the same reference numerals, and the description thereof will be omitted.

The gate electrode 34cA and the semiconductor layer 53A are provided on the protrusion portion 51A and cover a portion of the protrusion portion 51A. The gate electrode 34cB and the semiconductor layer 53B are provided on the protrusion portion 51B and cover a portion of the protrusion portion 51B. The gate electrode 34cA and the semiconductor layer 53A do not cover the entire upper surface of the protrusion portion 51A but cover a portion of the upper surface. Alternatively stated, there is a portion on the protrusion portion 51A that is not covered by the gate electrode 34cA or the semiconductor layer 53A. Similarly, there is a portion on the protrusion portion 51B that is not covered by the gate electrode 34cB or the semiconductor layer 53B. An end surface of the gate electrode 34cA in the Y direction is located inside the first transistor 90A from the boundary between the element isolation area 42 and the gate electrode 34aA. An end surface of the gate electrode 34cB in the Y direction is located inside the second transistor 90B from the boundary between the element isolation area 42 and the gate electrode 34aB. The width W1 of the gate electrode 34cA in the Y direction is narrower than the width W2 of the gate electrode 34aA in the Y direction. The width W1 of the gate electrode 34cB in the Y direction is narrower than the width W2 of the gate electrode 34aB in the Y direction.

Since the semiconductor storage device according to the first modification example includes the insulating layer 50 on the element isolation area 42, the same effect as that of the semiconductor storage device 100 according to the first embodiment can be obtained. Further, due to the presence of the insulating layer 50, the gate electrode 34cA and the gate electrode 34cB can be separated with a width wider than the width of the element isolation area 42 in the Y direction, and the processing stability of the transistor 90 is also excellent.

Figure 21:
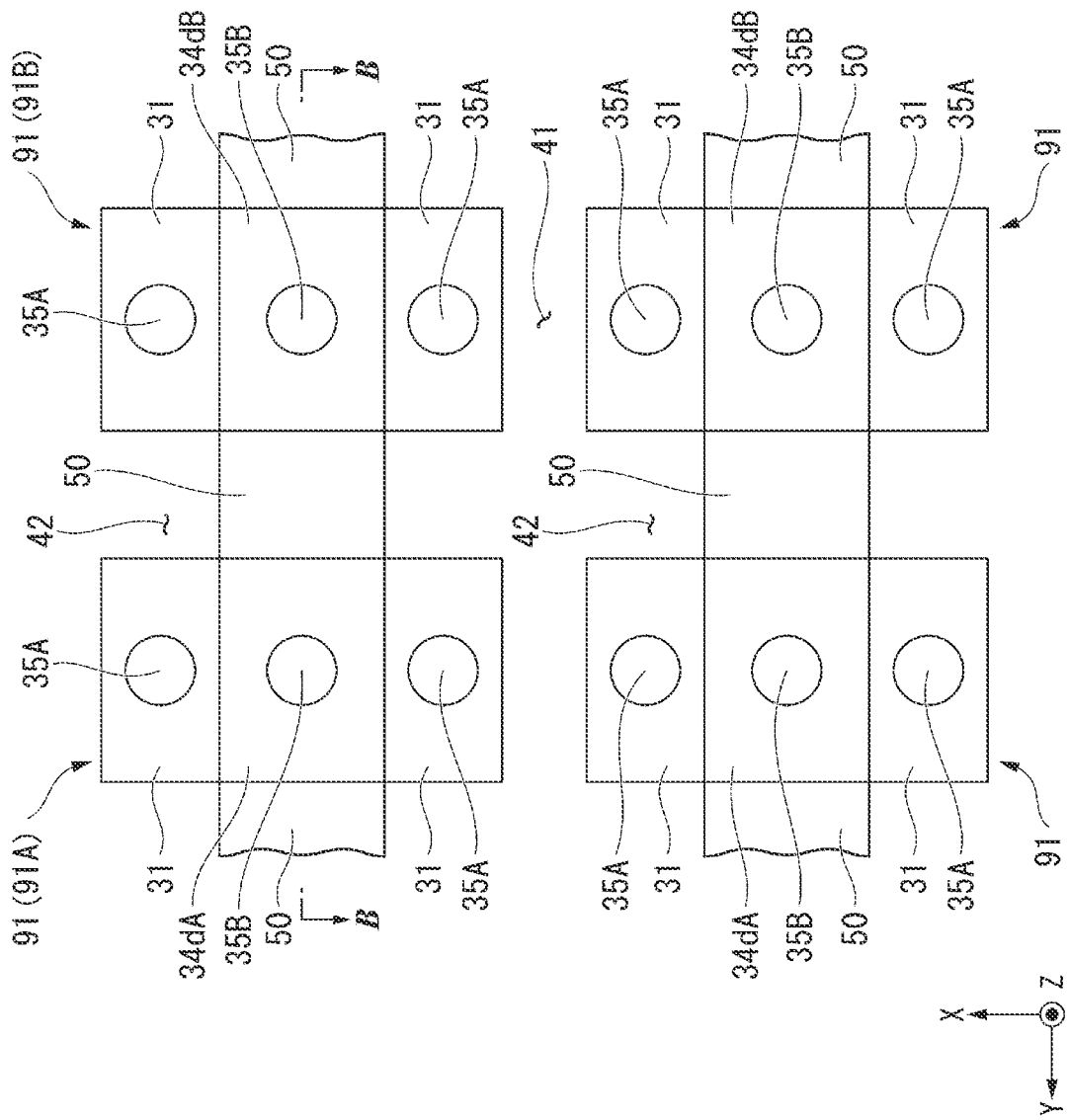
FIG. 21 is a plan view of the vicinity of a transistor in a circuit area of the semiconductor storage device according to a second modification example.
Figure 22:
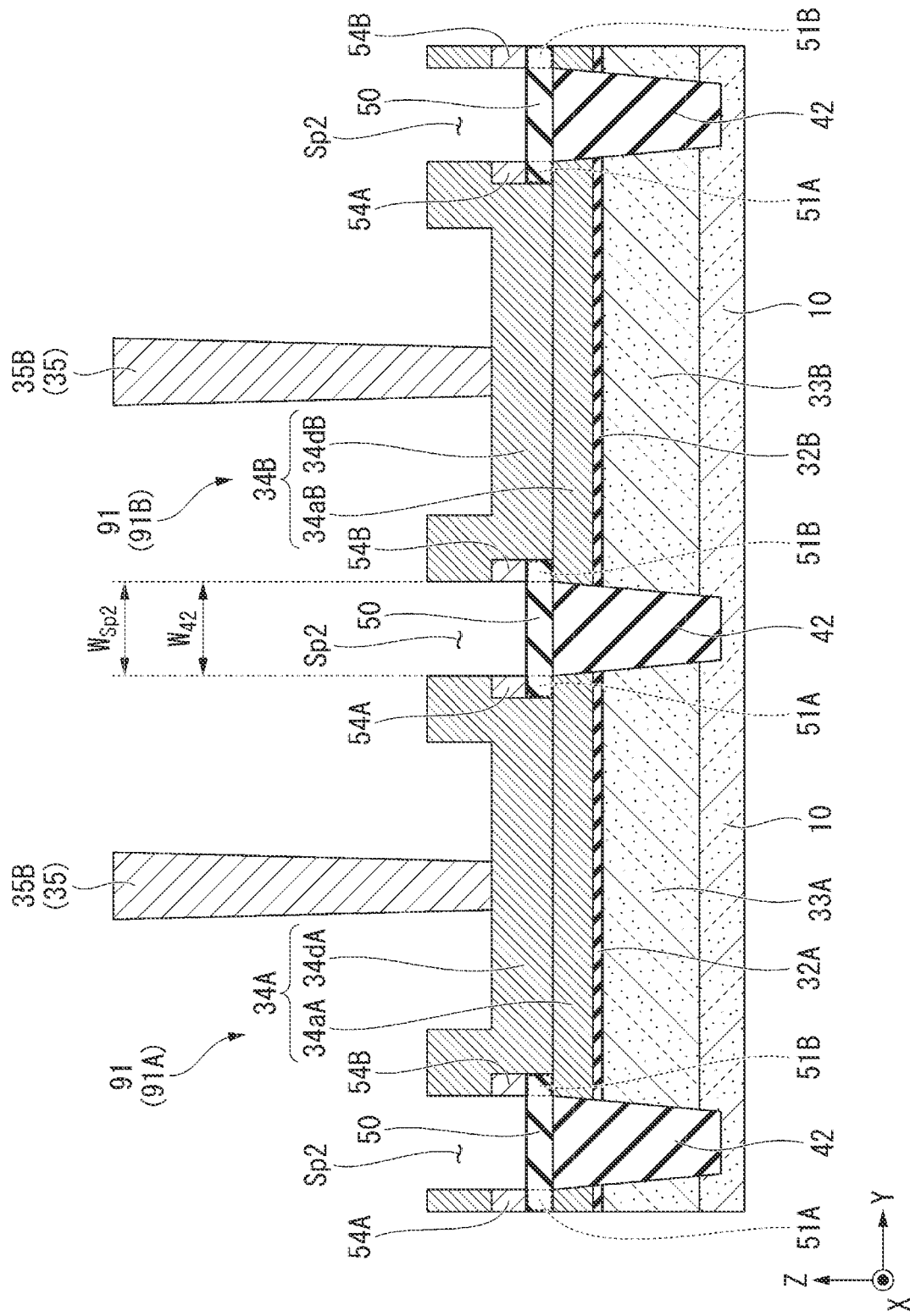
FIG. 22 is a cross-sectional view of the vicinity of the transistor in the circuit area of the semiconductor storage device according to the second modification example.

FIG. 21 is a plan view of the vicinity of the transistor 91 in the circuit area 3 of the semiconductor storage device 100 according to the second modification example. FIG. 22 is a cross-sectional view of the vicinity of the transistor 91 in the circuit area 3 of the semiconductor storage device 100 according to the second modification example. FIG. 22 shows a cross section taken along the line B-B in FIG. 21. The shapes of the upper surfaces of the insulating layer 50 and the gate electrode 34a as viewed from the Z direction are the same as those in FIG. 10.

In the second modification example, the width of the space Sp2 between the gate electrode 34dA and the gate electrode 34dB adjacent to each other in the Y direction is different from that of the first embodiment. The width of the space Sp2 in the Y direction is wider than that of the space Sp. The width $W_{Sp2}$ of the space Sp2 in the Y direction is, for example, equal to the width $W_{42}$ of the element isolation area 42 in the Y direction. When viewed from the Z direction, the boundary between the diffusion layer 31 and the element isolation area 42 and the boundary between the gate electrodes 34dA and 34dB and the element isolation area 42 are on the same plane. Although not shown, the space Sp2 is filled with an insulator such as silicon nitride or silicon oxide. The width of the gate electrode 34dA, the gate electrode 34dB, the semiconductor layer 54A, and the semiconductor layer 54B in the Y direction of the transistor 91 is different from that of the transistor 30 according to the first embodiment. Each of the gate electrodes 34dA and 34dB corresponds to the gate electrodes 34bA and 34bB of the first embodiment, and each of the semiconductor layers 54A and 54B corresponds to the semiconductor layers 52A and 52B of the first embodiment. In the second modification example, the same components as those in the first embodiment are designated by the same reference numerals, and the description thereof will be omitted.

The gate electrode 34dA and the semiconductor layer 54A cover the protrusion portion 51A. The gate electrode 34dB and the semiconductor layer 54B cover the protrusion portion 51B. The location in the Y direction of the end surface of the gate electrode 34dA in the Y direction matches the boundary between the element isolation area 42 and the gate electrode 34aA. The location in the Y direction of the end surface of the gate electrode 34dB in the Y direction matches the boundary between the element isolation area 42 and the gate electrode 34aB. The width of the gate electrode 34dA in the Y direction substantially matches the width of the gate electrode 34aA in the Y direction. The width of the gate electrode 34dB in the Y direction substantially matches the width of the gate electrode 34aB in the Y direction.

Since the semiconductor storage device according to the second modification example includes the insulating layer 50 on the element isolation area 42, the same effect as that of the semiconductor storage device 100 according to the first embodiment can be obtained.

Figure 23:
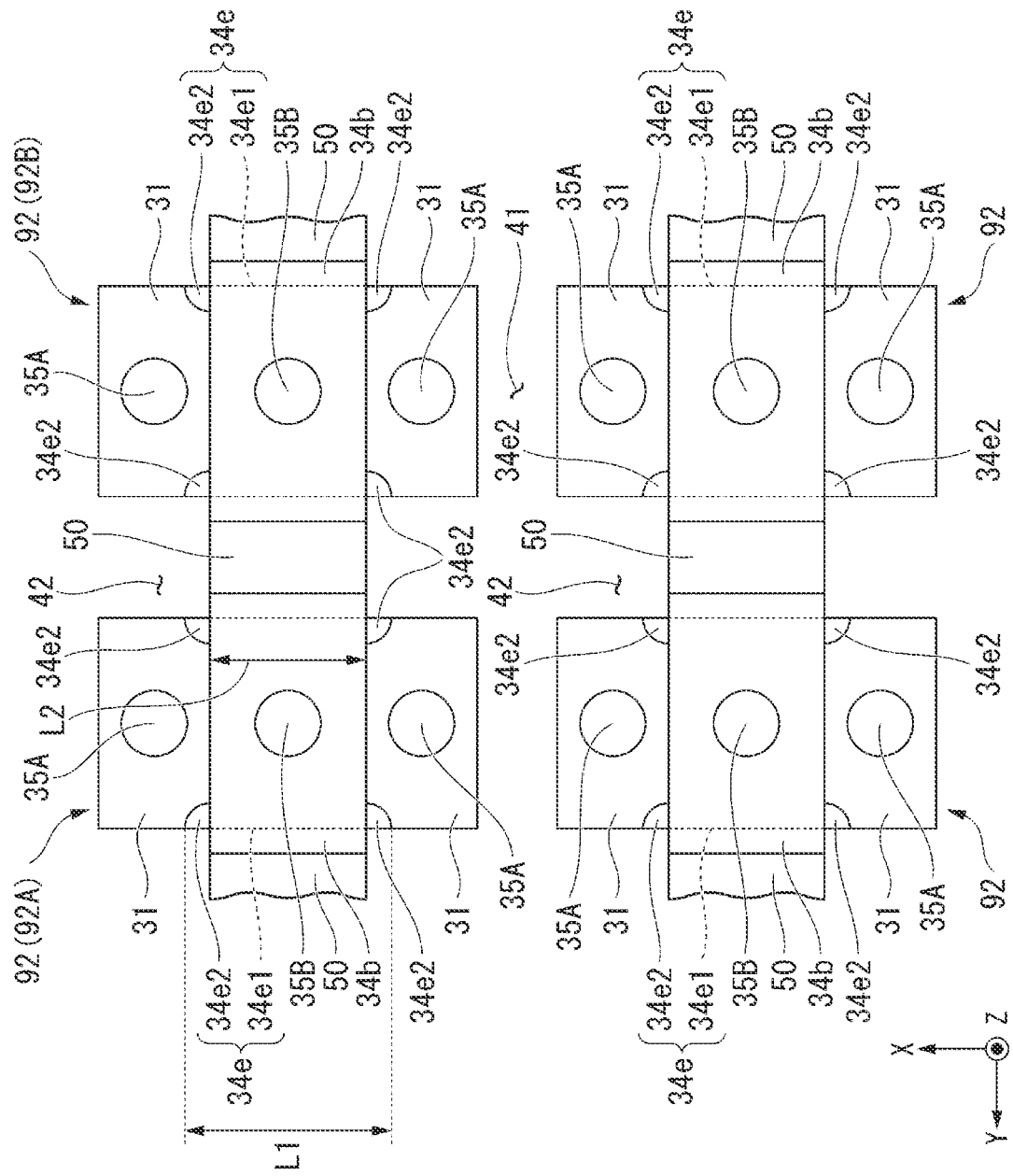
FIG. 23 is a plan view of the vicinity of a transistor in a circuit area of the semiconductor storage device according to a third modification example.

FIG. 23 is a plan view of the vicinity of the transistor 92 in the circuit area 3 of the semiconductor storage device 100 according to a third modification example. In the third modification example, the same components as those in the first embodiment are designated by the same reference numerals, and the description thereof will be omitted.

The transistor 92 according to the third modification example is different from the transistor 30 according to the first embodiment in that the gate electrode 34a is replaced with a gate electrode 34e having a different plan view shape. The gate electrode 34e includes a first portion 34e1 and a second portion 34e2. The first portion 34e1 is at a location overlapping with the gate electrode 34b and is a rectangular portion similar to the gate electrode 34a. The second portion 34e2 is a portion protruding in the X direction from the gate electrode 34b. The second portion 34e2 is provided at each of the four corners of the first portion 34e1, for example. The second portion 34e2 may not be present at all four corners of the first portion 34e1.

The gate electrode 34e at the boundary between the transistor 92 and the element isolation area 42 includes, for example, a first portion 34e1 and two second portions 34e2. In contrast to this, the gate electrode 34e at the center of the transistor 92 in the Y direction includes the first portion 34e1. Therefore, the width L1 of the gate electrode 34e in the X direction at the boundary between the transistor 92 and the element isolation area 42 is wider than the width L2 of the gate electrode 34e in the X direction at the center of the transistor 92 in the X direction.

The second portion 34e2 may be manufactured by adjusting an etching condition for removing a portion of the semiconductor layer 81 together with the metal layer 85 (see FIGS. 16 and 17). When processing the metal layer 85, the portion corresponding to the second portion 34e2 (dotted line portion in FIG. 17) is thicker than the other portions by the amount of the insulating layer 50 and the semiconductor layer 84. Therefore, the semiconductor layer 81 that is below the insulating layer 50 and the semiconductor layer 84 is less likely to be etched than other portions. Therefore, by adjusting the etching condition, the second portion 34e2 is formed.

Since the semiconductor storage device according to the third modification example includes the insulating layer 50 on the element isolation area 42, the same effect as that of the semiconductor storage device 100 according to the first embodiment can be obtained.

Figure 24:
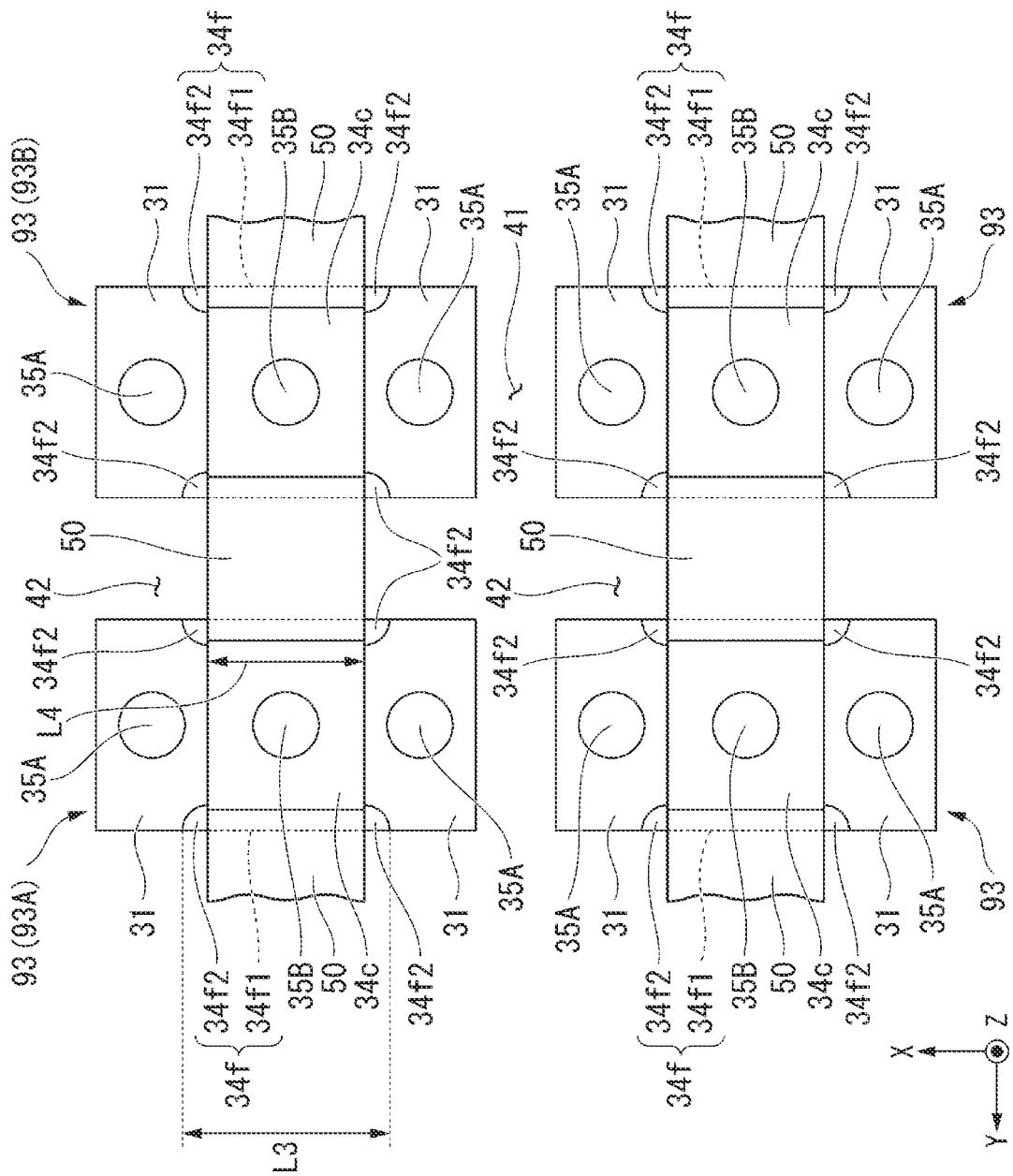
FIG. 24 is a plan view of the vicinity of a transistor in a circuit area of a semiconductor storage device according to a fourth modification example.

FIG. 24 is a plan view of the vicinity of the transistor 93 in the circuit area 3 of the semiconductor storage device 100 according to a fourth modification example. In the fourth modification example, the same components as those in the first modification example are designated by the same reference numerals, and the description thereof will be omitted.

The transistor 93 according to the fourth modification example is different from the transistor 90 according to the first modification example in that the gate electrode 34f is replaced with a gate electrode 34a having a different plan view shape. The gate electrode 34f includes a first portion 34f1 and a second portion 34f2. The first portion 34f1 is at a location overlapping with the gate electrode 34b and is a rectangular portion similar to the gate electrode 34a. The second portion 34f2 is a portion protruding in the X direction from the gate electrode 34c. The second portion 34f2 is provided at each of the four corners of the first portion 34f1, for example. The second portion 34f2 may not be present at all four corners of the first portion 34f1.

The gate electrode 34f at the boundary between the transistor 93 and the element isolation area 42 includes, for example, a first portion 34f1 and two second portions 34f2. In contrast to this, the gate electrode 34f at the center of the transistor 93 in the Y direction includes the first portion 34f1. Therefore, the width L3 of the gate electrode 34f in the X direction at the boundary between the transistor 93 and the element isolation area 42 is wider than the width L4 of the gate electrode 34f in the X direction at the center of the transistor 93 in the X direction.

The second portion 34f2 may be manufactured by the same procedure as that of the second portion 34e2 according to the third modification example.

Since the semiconductor storage device according to the fourth modification example includes the insulating layer 50 on the element isolation area 42, the same effect as that of the semiconductor storage device 100 according to the first embodiment can be obtained.

Further, also in the second modification example, the gate electrode 34a may be replaced with a semiconductor layer including the first portion and the second portion, as in the third modification example and the fourth modification example.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a semiconductor substrate including a first well region and a second well region arranged in a first direction;
   a first transistor including a first gate insulating layer provided above the first well region, a first gate electrode provided above the first gate insulating layer and having a semiconductor, and a second gate electrode provided above the first gate electrode and having a metal;
   a second transistor including a second gate insulating layer provided above the second well region, a third gate electrode provided above the second gate insulating layer and having a semiconductor, and a fourth gate electrode provided above the third gate electrode and having a metal;
   an element isolation area disposed between the first well region and the second well region; and
   a first insulating layer formed above the element isolation area, wherein
   the first insulating layer has a first protrusion portion that extends over the first gate electrode and a second protrusion portion that extends over the third gate electrode,
   a portion of the second gate electrode is formed above the first protrusion portion, and
   a portion of the fourth gate electrode is formed above the second protrusion portion, wherein
   at least the portion of the second gate electrode and at least the portion of the fourth gate electrode extend over the element isolation area.

2. The semiconductor storage device according to claim 1, further comprising:
   a first semiconductor layer interposed between the first protrusion portion and the second gate electrode; and
   a second semiconductor layer interposed between the second protrusion portion and the fourth gate electrode.

3. The semiconductor storage device according to claim 1, wherein
   a width of the second gate electrode is narrower than a width of the first gate electrode in the first direction.

4. The semiconductor storage device according to claim 1, wherein
   in the first direction, a distance between the second gate electrode and the fourth gate electrode is wider than the element isolation area.

5. The semiconductor storage device according to claim 1, wherein
   the first protrusion portion includes a portion that is not covered by the second gate electrode.

6. The semiconductor storage device according to claim 1, wherein the second protrusion portion includes a portion that is not covered by the fourth gate electrode.

7. The semiconductor storage device according to claim 1, wherein
in a second direction orthogonal to the first direction, a width of the first gate electrode at a side of a boundary between the first transistor or the second transistor and the element isolation area is wider than another width of the first gate electrode at a center of the first transistor or the second transistor.

8. A semiconductor storage device comprising:
a semiconductor substrate including a first well region and a second well region arranged in a first direction;
a first transistor including a first gate insulating layer provided above the first well region, a first gate electrode provided above the first gate insulating layer and having a semiconductor, and a second gate electrode provided above the first gate electrode and having a metal;
a second transistor including a second gate insulating layer provided above the second well region, a third gate electrode provided above the second gate insulating layer and having a semiconductor, and a fourth gate electrode provided above the third gate electrode and having a metal;
an element isolation area disposed between the first well region and the second well region; and
a first insulating layer formed above the element isolation area, wherein
the first insulating layer has a first protrusion portion that extends over the first gate electrode and a second protrusion portion that extends over the third gate electrode,
a portion of the second gate electrode is formed above the first protrusion portion,
a portion of the fourth gate electrode is formed above the second protrusion portion; and
a capacitive element including a second insulating layer, a third semiconductor layer, a third insulating layer, a fourth semiconductor layer, and a second metal layer sequentially arranged on the semiconductor substrate,
wherein the third insulating layer and the first insulating layer include the same material.

9. The semiconductor storage device according to claim 8, further comprising:
a first semiconductor layer interposed between the first protrusion portion and the second gate electrode; and
a second semiconductor layer interposed between the second protrusion portion and the fourth gate electrode.

10. The semiconductor storage device according to claim 8, wherein
a width of the second gate electrode is narrower than a width of the first gate electrode in the first direction.

11. The semiconductor storage device according to claim 8, wherein
in the first direction, a distance between the second gate electrode and the fourth gate electrode is wider than the element isolation area.

12. The semiconductor storage device according to claim 8, wherein
the first protrusion portion includes a portion that is not covered by the second gate electrode.

13. The semiconductor storage device according to claim 8, wherein
the second protrusion portion includes a portion that is not covered by the fourth gate electrode.

14. The semiconductor storage device according to claim 8, wherein
in a second direction orthogonal to the first direction, a width of the first gate electrode at a side of a boundary between the first transistor or the second transistor and the element isolation area is wider than another width of the first gate electrode at a center of the first transistor or the second transistor.

15. A semiconductor storage device comprising:
a semiconductor substrate including a first well region and a second well region arranged in a first direction;
a first transistor including a first gate insulating layer provided above the first well region, a first gate electrode provided above the first gate insulating layer and having a semiconductor, and a second gate electrode provided above the first gate electrode and having a metal;
a second transistor including a second gate insulating layer provided above the second well region, a third gate electrode provided above the second gate insulating layer and having a semiconductor, and a fourth gate electrode provided above the third gate electrode and having a metal;
an element isolation area disposed between the first well region and the second well region;
a first insulating layer formed above the element isolation area, wherein
the first insulating layer has a first protrusion portion that extends over the first gate electrode and a second protrusion portion that extends over the third gate electrode,
a portion of the second gate electrode is formed above the first protrusion portion,
a portion of the fourth gate electrode is formed above the second protrusion portion; and
a resistance element formed on the semiconductor substrate, wherein
the resistance element includes a fifth semiconductor layer, a fourth insulating layer formed on the fifth semiconductor layer and having an opening, and an electrode formed in the opening, and
the fourth insulating layer and the first insulating layer include the same material.

16. The semiconductor storage device according to claim 15, further comprising:
a first semiconductor layer interposed between the first protrusion portion and the second gate electrode; and
a second semiconductor layer interposed between the second protrusion portion and the fourth gate electrode.

17. The semiconductor storage device according to claim 15, wherein
a width of the second gate electrode is narrower than a width of the first gate electrode in the first direction.

18. The semiconductor storage device according to claim 15, wherein
in the first direction, a distance between the second gate electrode and the fourth gate electrode is wider than the element isolation area.

19. The semiconductor storage device according to claim 15, wherein
the first protrusion portion includes a portion that is not covered by the second gate electrode.

20. The semiconductor storage device according to claim 15, wherein the second protrusion portion includes a portion that is not covered by the fourth gate electrode.

\* \* \* \* \*